United States Patent
Terada et al.

(10) Patent No.: US 6,849,484 B2
(45) Date of Patent: Feb. 1, 2005

(54) METHOD OF MANUFACTURING SEMICONDUCTOR DEVICE

(75) Inventors: Takashi Terada, Hyogo (JP); Motoi Ashida, Hyogo (JP); Tomohiro Hosokawa, Hyogo (JP); Yasuichi Masuda, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 84 days.

(21) Appl. No.: 10/435,046

(22) Filed: May 12, 2003

(65) Prior Publication Data

US 2004/0097064 A1 May 20, 2004

(30) Foreign Application Priority Data

Nov. 18, 2002 (JP) ........................................ 2002-333767

(51) Int. Cl.[7] ............................................. H01L 21/338
(52) U.S. Cl. ....................................................... 438/180
(58) Field of Search ................................. 438/180, 229, 438/299, 320, 339, 364, 582, 648, 656, 683, 685, 285, 86

(56) References Cited

U.S. PATENT DOCUMENTS 5,432,105 A * 7/1995 Chien ......................... 438/228

FOREIGN PATENT DOCUMENTS

| JP | 08-316308 | 11/1996 |
|----|-----------|---------|
| JP | 09-51036 | 2/1997 |
| JP | P2001-44294 A | 2/2001 |
| JP | P2001-217200 A | 8/2001 |

* cited by examiner

*Primary Examiner*—Craig A. Thompson
(74) *Attorney, Agent, or Firm*—McDermott Will & Emery LLP

(57) ABSTRACT

As an opening exposing a surface of an element-forming region positioned in a region lying between two gate electrodes, a first opening is formed based on a resist pattern formed such that a portion of a region where the opening is formed overlaps two-dimensionally with a portion of one gate electrode. As an opening exposing a surface of one gate electrode, a second opening is formed based on a resist pattern formed such that a region where the opening is formed overlaps two-dimensionally solely with one gate electrode. Here, the first opening is covered with a non-photosensitive, organic film and the resist pattern. Thereafter, a tungsten interconnection is formed in the first and second openings. Thus, a semiconductor device, of which production cost is reduced, and in which electrical short-circuit and falling off of an interconnection are suppressed, can be obtained.

10 Claims, 26 Drawing Sheets

METHOD OF MANUFACTURING SEMICONDUCTOR DEVICE

BACKGROUND OF THE INVENTION

Field of the Invention

The present invention relates to a method of manufacturing a semiconductor device, and more particularly to a method of manufacturing a semiconductor device having a self-aligned contact configuration.

As a semiconductor device is made smaller, a margin for alignment in each photolithographical process becomes narrower. In order to implement higher integration of the semiconductor device without restriction by the alignment margin, for example, a self-aligned contact configuration is adopted in an MOS (Metal Oxide Semiconductor) transistor in a memory cell, as described in Japanese Patent Laying-Open No. 2001-44294, for example.

One example of such a self-aligned contact configuration will now be described. Two gate electrodes are formed with a prescribed space apart from each other, so as to intersect an element-forming region formed on the surface of a semiconductor substrate. On side surfaces of respective gate electrodes, a sidewall nitride film is formed.

In addition, on the upper surface of respective gate electrodes, a silicon nitride film of a relatively large thickness is formed. A silicon nitride film of a relatively small thickness is further formed so as to cover the gate electrode and the element-forming region.

Then, a silicon oxide film is formed as an interlayer insulating film on the semiconductor substrate so as to cover the gate electrode. In the silicon oxide film, a contact hole exposing a portion of the element-forming region lying between two gate electrodes is formed.

The contact hole is formed in the following manner. That is, the silicon oxide film is anisotropically etched using as a mask a prescribed resist pattern formed thereon, and the exposed silicon nitride film of a relatively small thickness is removed by etching.

Here, the gate electrode is covered by the silicon nitride film of a relatively large thickness and by the sidewall nitride film. Therefore, the silicon nitride film of a relatively large thickness and the sidewall nitride film are not removed but remain, even after the silicon nitride film of a relatively small thickness is removed.

Accordingly, even if the resist pattern for forming the contact hole is displaced, the contact hole exposing the portion of the element-forming region lying between two gate electrodes is formed without exposing the gate electrode.

In this manner, the portion of the element-forming region lying between two gate electrodes is exposed in a self-aligned manner, based on a difference of etching property between the silicon oxide film and the silicon nitride film, and in accordance with a relation in arrangement of two gate electrodes. Thus, the contact hole formed in such a manner is specifically referred to as a "self-aligned contact hole," and a configuration with such a contact hole is referred to as a "self-aligned contact configuration."

After the self-aligned contact hole is formed, a prescribed conductive layer filling the self-aligned contact hole is formed.

In order to form such a self-aligned contact hole, one mask (a reticle) is required.

Meanwhile, in order to electrically connect the portion of the element-forming region lying between two gate electrodes to one gate electrode out of the two gate electrodes, a process step in the following is further required. First, a gate contact hole exposing the surface of one gate electrode is formed in the silicon oxide film and the silicon nitride film of a relatively large thickness.

Then, a prescribed conductive layer filling the gate contact hole is formed. Next, a tungsten film serving as an interconnection is formed on the silicon oxide film. Through a prescribed photolithographical process and etching on the tungsten film, a tungsten interconnection electrically connecting the conductive layer filling the self-aligned contact hole to the conductive layer filling the gate contact hole is formed.

In this manner, the portion of the element-forming region lying between two gate electrodes is electrically connected to one electrode via the conductive layer filling the self-aligned contact hole, the tungsten interconnection, and the conductive layer filling the gate contact hole.

Here, two masks are required, that is, one mask for forming the gate contact hole, and another mask for forming the tungsten interconnection. This means that, in addition to a mask for forming the self-aligned contact hole, three masks in total are required to electrically connect the portion of the element-forming region lying between the two gate electrodes to one gate electrode.

As one measure for reducing production cost, reduction of the number of masks (reticles) has been demanded. In the step of electrically connecting the portion of the element-forming region lying between the two gate electrodes to one electrode as well, reduction of the number of the masks has been demanded.

In addition, as the tungsten interconnection is made smaller with minituarization of the semiconductor device, an interval between one tungsten interconnection and another tungsten interconnection adjacent to each other becomes smaller, which has resulted in higher tendency of a short-circuit.

For example, the short-circuit occurs between one gate electrode electrically connected to one tungsten interconnection and another gate electrode electrically connected to another tungsten interconnection. Accordingly, a function as the semiconductor device cannot be attained.

Moreover, as the tungsten interconnection is made smaller, the tungsten interconnection formed on the silicon oxide film tends to fall off from the silicon oxide film, and a desired pattern of the tungsten interconnection cannot be obtained.

SUMMARY OF THE INVENTION

The present invention was made to solve the above-described problems. An object of the present invention is to provide a method of manufacturing a semiconductor device, of which production cost is reduced, and in which electrical short-circuit and falling off of an interconnection are suppressed.

A method of manufacturing a semiconductor device according to the present invention includes the steps of: forming on a main surface of a semiconductor substrate with a space apart from each other, one electrode portion and another electrode portion covered respectively with a first insulating film; forming on the semiconductor substrate, a second insulating film having an etching property different from the first insulating film, so as to cover one electrode portion and the another electrode portion; forming in a self-aligned manner on the second insulating film, a first opening exposing a portion of a region of the semiconductor substrate lying between one electrode portion and another electrode portion; forming a second opening exposing a surface of one electrode in the second insulating film and the first insulating film; and forming a conductive layer within the first opening and the second opening. A first forming region where the first opening is formed and a second forming region where the second opening is formed are arranged so as to include a portion two-dimensionally overlapping with each other, and are formed such that the first opening communicates with the second opening.

Conventionally, in order to implement a configuration in which a portion of a region of the semiconductor substrate lying between two electrodes is electrically connected to one electrode, three masks are required. In contrast, according to the method of manufacturing a semiconductor device of the present invention, such a configuration can be implemented with two masks, that is, a mask for forming a first opening, and a mask for forming a second opening. Thus, the number of masks as well as the production cost can be reduced. In addition, since the conductive layer is formed so as to fill the first and second openings, the conductive layer will not fall off.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
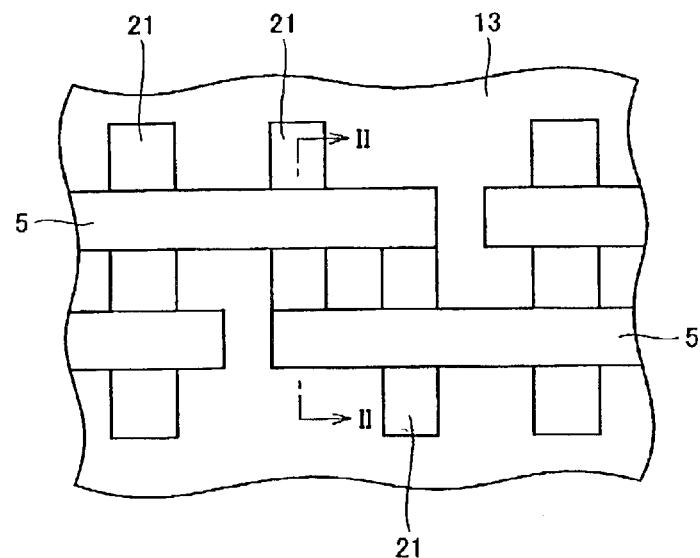
FIG. 1 is a plan view showing one process step in a method of manufacturing a semiconductor device according to a first embodiment of the present invention.
Figure 2:
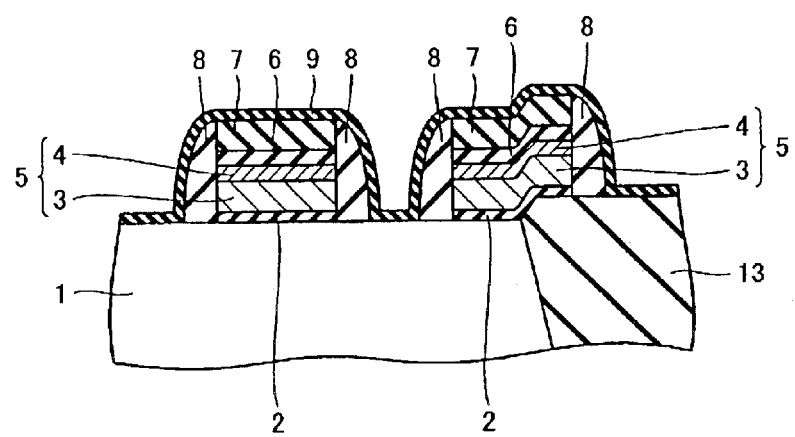
FIG. 2 is a cross-sectional view along the line II—II shown in FIG. 1 in the first embodiment.

A method of manufacturing a semiconductor device according to the first embodiment of the present invention will be described. First, as shown in FIGS. 1 and 2, an element isolation insulating film 13 is formed in a prescribed region of a semiconductor substrate 1, whereby an element-forming region 21 for forming a semiconductor element is formed on the surface of semiconductor substrate 1.

Next, on semiconductor substrate 1, with an insulating film serving as a gate insulating film being interposed, a polysilicon film serving as a gate electrode and a tungsten silicide film (both not shown) are successively formed. Further, on the tungsten silicide film, the silicon nitride film of a relatively large thickness (not shown) is formed with a TEOS film being interposed.

The silicon nitride film, the TEOS film, the tungsten silicide film, the polysilicon film, and the insulating film are etched in a prescribed manner. Accordingly, a gate electrode 5 including a polysilicon film 3 and a tungsten silicide film 4 is formed on a gate insulating film 2, and a TEOS film 6 and a silicon nitride film 7 as a first insulating film are left on the upper surface of gate electrode 5.

Next, a silicon nitride film (not shown) of a thickness of several tens of nm (several hundred Å) is formed, so as to cover gate electrode 5, TEOS film 6 and silicon nitride film 7. By anisotropically etching the silicon nitride film, a sidewall nitride film 8 serving as the first insulating film is formed respectively on opposing side surfaces of gate electrode 5, for example.

Next, a silicon nitride film 9 of a thickness smaller than silicon nitride film 7 is formed on semiconductor substrate 1, so as to cover sidewall nitride film 8 and silicon nitride film 7.

Figure 3:
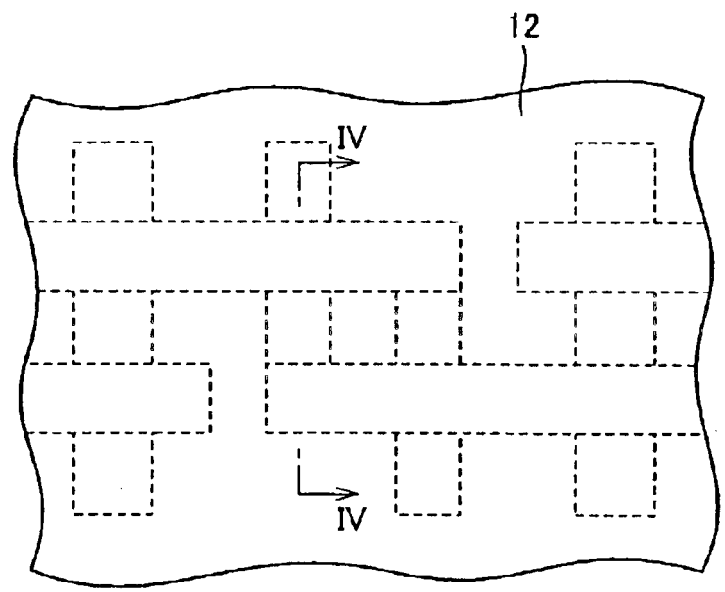
FIG. 3 is a plan view showing a step performed after the step shown in FIG. 1 in the first embodiment.
Figure 4:
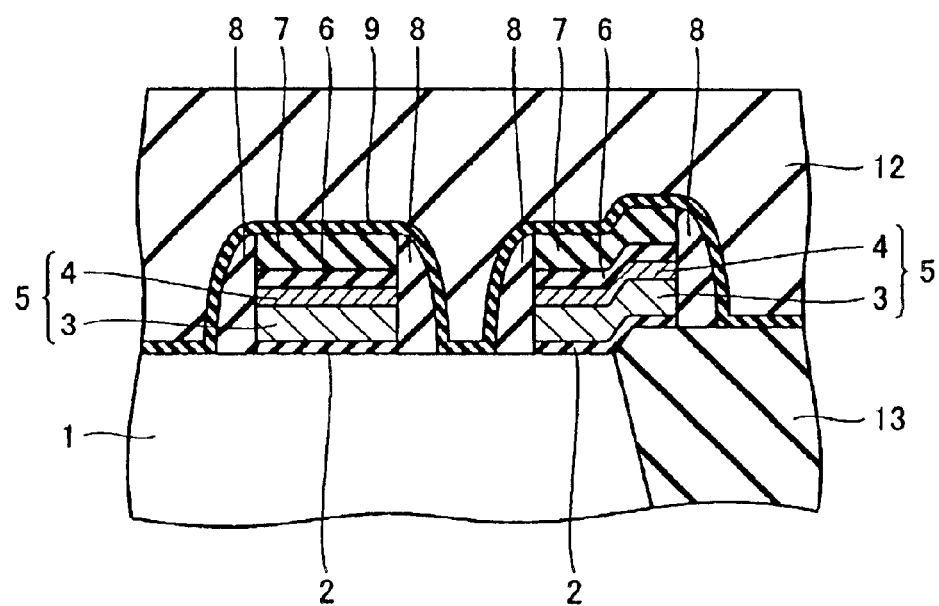
FIG. 4 is a cross-sectional view along the line IV—IV shown in FIG. 3 in the first embodiment.

Next, as shown in FIGS. 3 and 4, a silicon oxide film 12 serving as a second insulating film is formed on semiconductor substrate 1, so as to cover silicon nitride film 9. Then, a resist (not shown) is applied on silicon oxide film 12.

Figure 5:
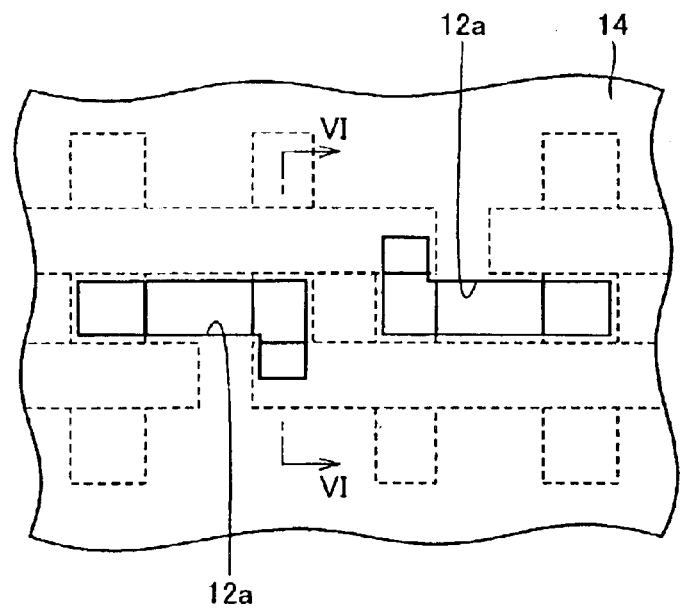
FIG. 5 is a plan view showing a step performed after the step shown in FIG. 3 in the first embodiment.
Figure 6:
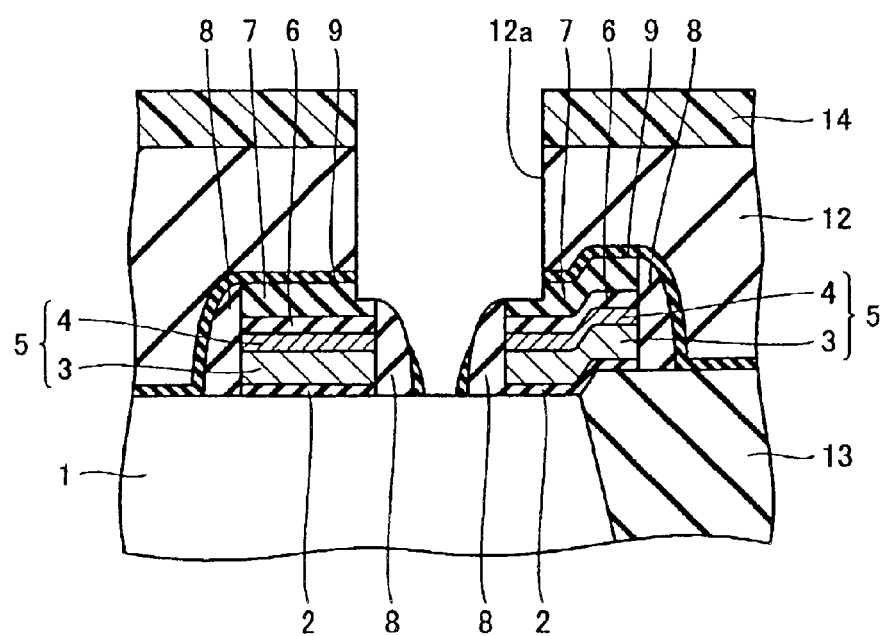
FIG. 6 is a cross-sectional view along the line VI—VI shown in FIG. 5 in the first embodiment.

Through the photolithographical process with a prescribed mask (reticle) on the resist, as shown in FIGS. 5 and 6, a resist pattern 14 for forming an opening exposing the surface of element-forming region 21 positioned in a region lying between two gate electrodes 5 is formed. Here, resist pattern 14 is formed such that a portion of a region where the opening is formed overlaps two-dimensionally (on a layout) with a portion of gate electrode 5.

Figure 7:
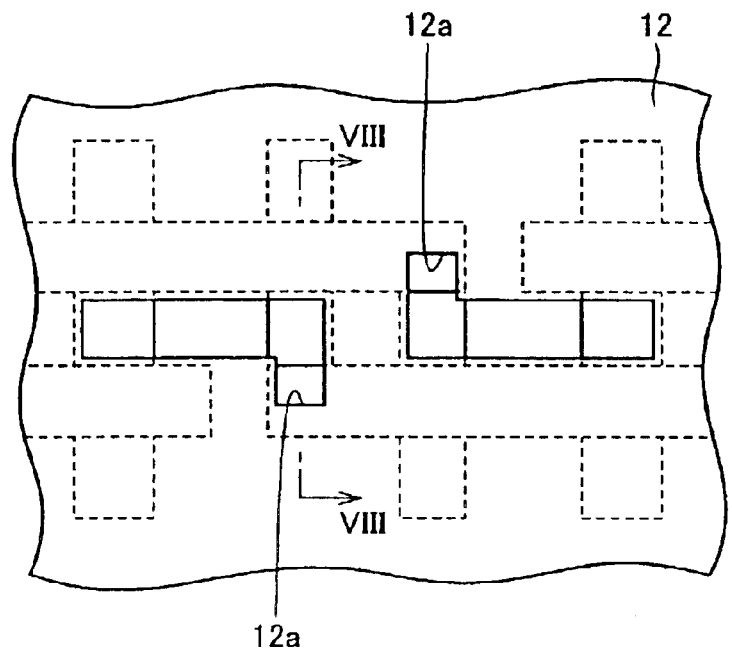
FIG. 7 is a plan view showing a step performed after the step shown in FIG. 5 in the first embodiment.
Figure 8:
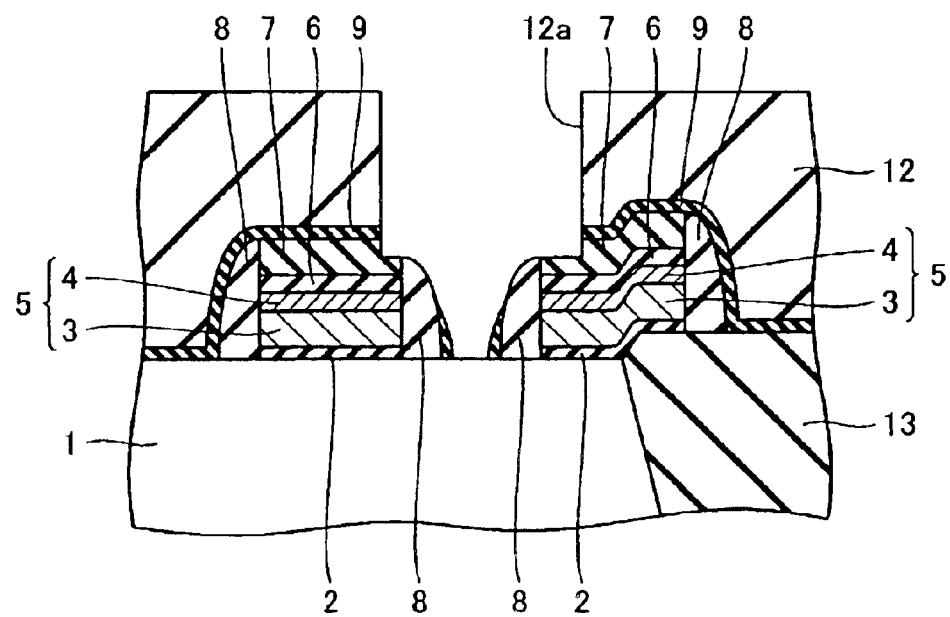
FIG. 8 is a cross-sectional view along the line VIII—VIII shown in FIG. 7 in the first embodiment.

Using resist pattern 14 as a mask, silicon oxide film 12 is anisotropically etched, to expose silicon nitride film 9. By anisotropically etching the exposed silicon nitride film 9, an opening 12a serving as the first opening exposing the surface of semiconductor substrate 1 (surface of the element-forming region) is formed. Thereafter, resist pattern 14 is removed, as shown in FIGS. 7 and 8.

It is to be noted that, when the surface of semiconductor substrate 1 is excessively etched in exposing the element-forming region, impurity ions of a prescribed conductivity type are injected through opening 12a, as described later.

Figure 9:
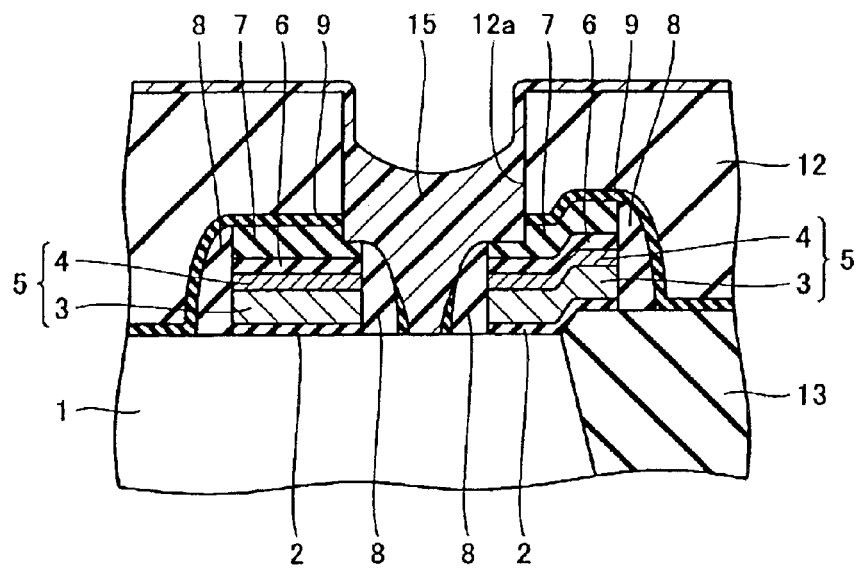
FIG. 9 is a cross-sectional view showing a step performed after the step shown in FIG. 8 in the first embodiment.

Next, using a prescribed application apparatus, a non-photosensitive, organic material is applied to semiconductor substrate 1, and a non-photosensitive organic film 15 is formed mainly in opening 12a, as shown in FIG. 9. Moreover, non-photosensitive organic film 15 is also formed on the upper surface of silicon oxide film 12 to a relatively small thickness. Here, for example, an anti-reflection coating is desirable as a non-photosensitive organic film.

Figure 10:
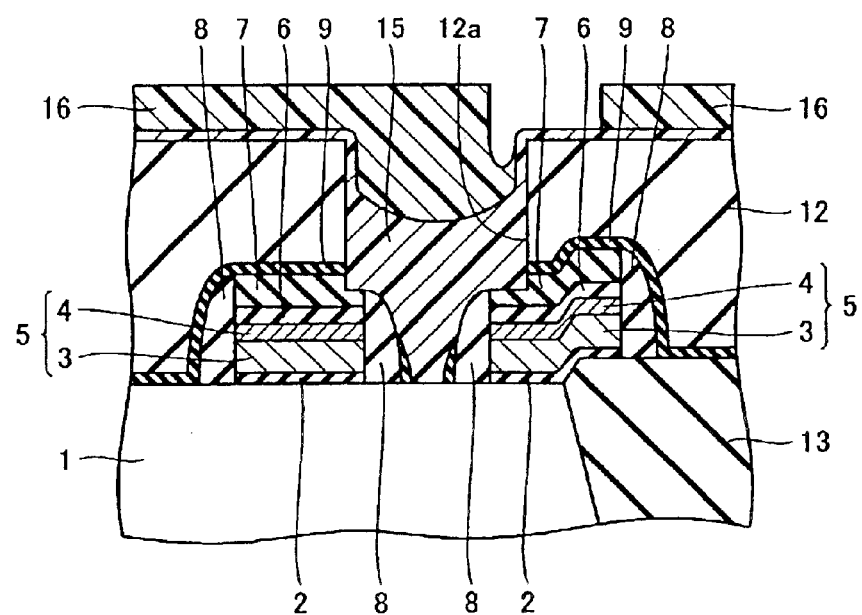
FIG. 10 is a cross-sectional view showing a step performed after the step shown in FIG. 9 in the first embodiment.

On organic film 15, a resist (not shown) is applied. The photolithographical process with a prescribed mask (reticle) is performed on the resist, and as shown in FIG. 10, a resist pattern 16 for forming an opening exposing one gate electrode 5 out of two gate electrodes 5 is formed.

Figure 11:
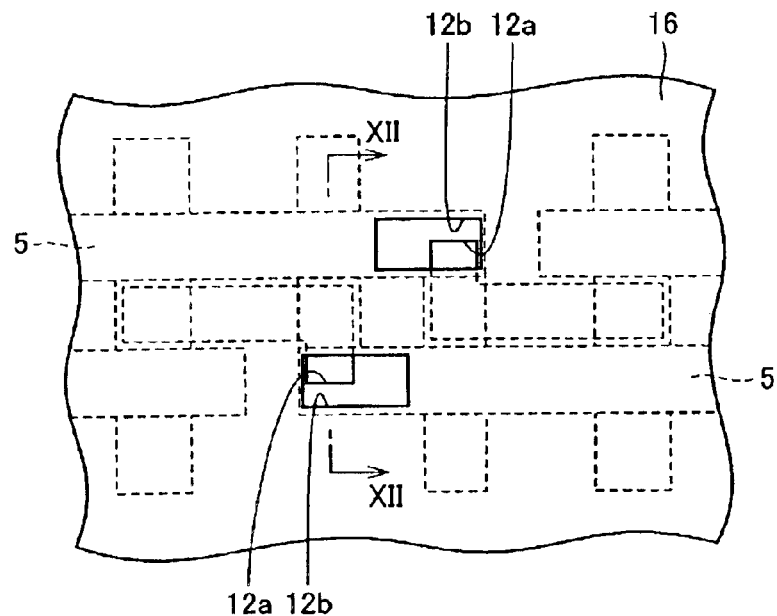
FIG. 11 is a plan view showing a step performed after the step shown in FIG. 10 in the first embodiment.

Here, as shown in FIG. 11, resist pattern 16 is formed such that a region where the opening is formed overlaps two-dimensionally (on the layout) only with gate electrode 5.

In the photolithographical process, the intensity of light exposure lowers toward the bottom of opening 12a (the upper surface of organic film 15). Therefore, the resist is not exposed in this portion, and resist pattern 16 is formed, covering non-photosensitive organic film 15. In other words, opening 12a is covered with both organic film 15 and resist pattern 16 serving as a protection film.

Figure 12:
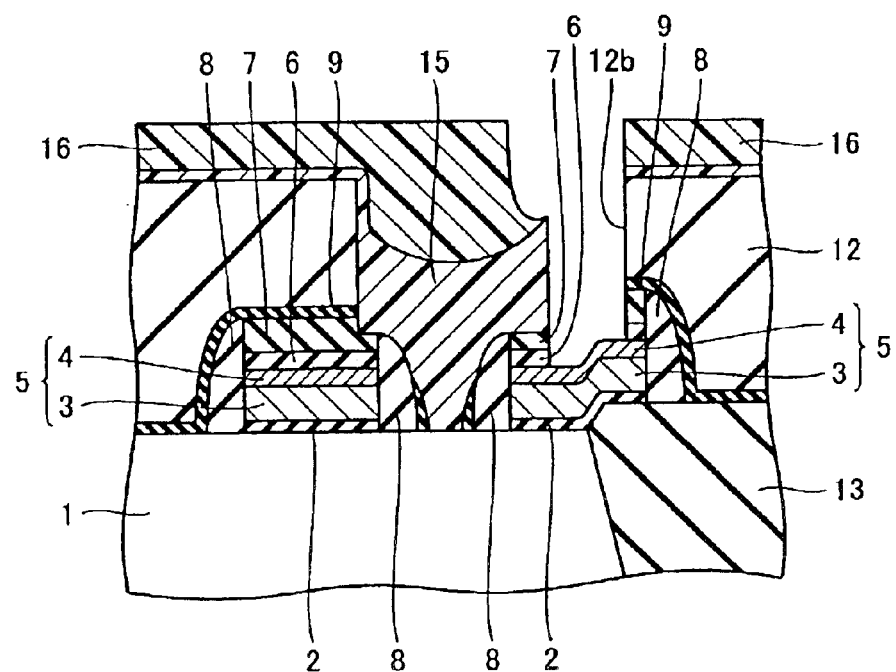
FIG. 12 is a cross-sectional view along the line XII—XII shown in FIG. 11 in the first embodiment.

Next, as shown in FIG. 12, using resist pattern 16 as a mask, prescribed anisotropic etching is performed on silicon oxide film 12, silicon nitride films 9, 7 and TEOS film 6 respectively. Thus, an opening 12b as a second opening exposing the surface of gate electrode 5 is formed.

In anisotropic etching, since opening 12a is covered with resist pattern 16 and organic film 15, damage caused by etching can be avoided on the surface of the element-forming region (semiconductor substrate 1) positioned at the bottom of opening 12a.

Figure 13:
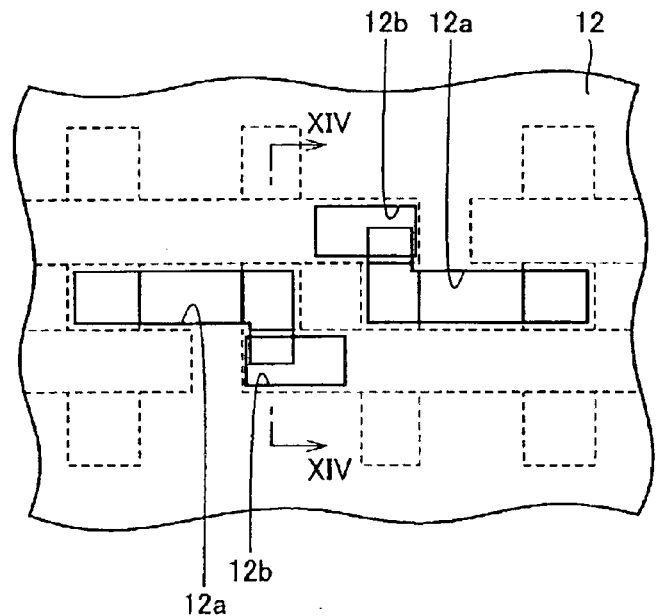
FIG. 13 is a plan view showing a step performed after the step shown in FIG. 11 in the first embodiment.
Figure 14:
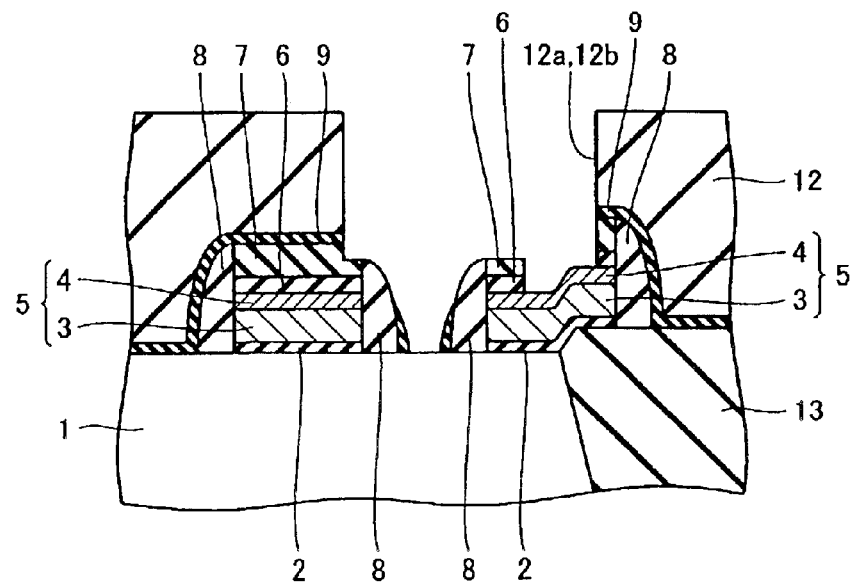
FIG. 14 is a cross-sectional view along the line XIV—XIV shown in FIG. 13 in the first embodiment.

Thereafter, as shown in FIGS. 13 and 14, resist pattern 16 and non-photosensitive organic film 15 are removed by oxygen plasma processing, for example.

Figure 15:
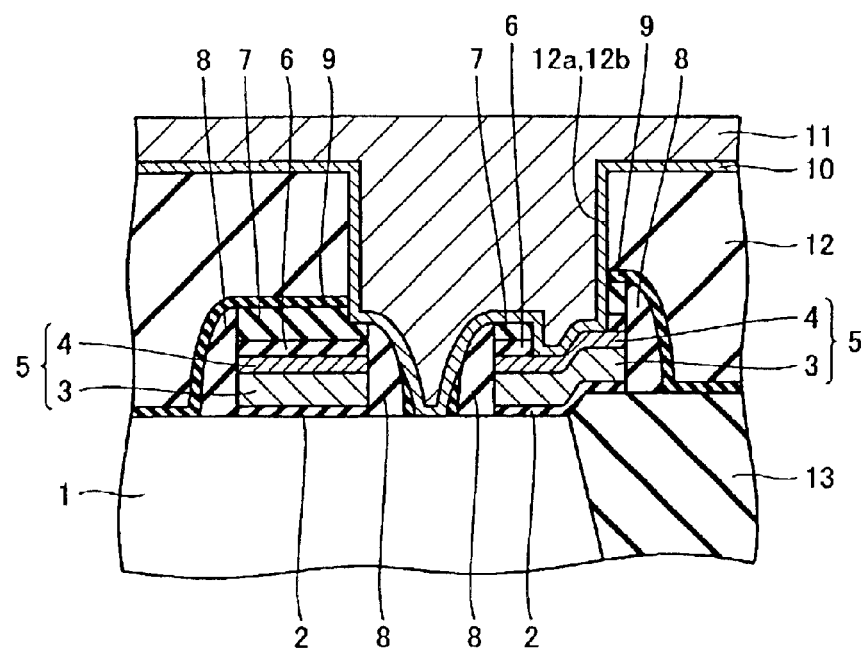
FIG. 15 is a cross-sectional view showing a step performed after the step shown in FIG. 13 in the first embodiment.

Next, as shown in FIG. 15, a barrier metal 10 is formed on silicon oxide film 12 as well as in openings 12a and 12b. A tungsten film 11 is formed on barrier metal 10. Here, a film obtained by layering titanium and titanium nitride is desirable as a barrier metal.

Figure 16:
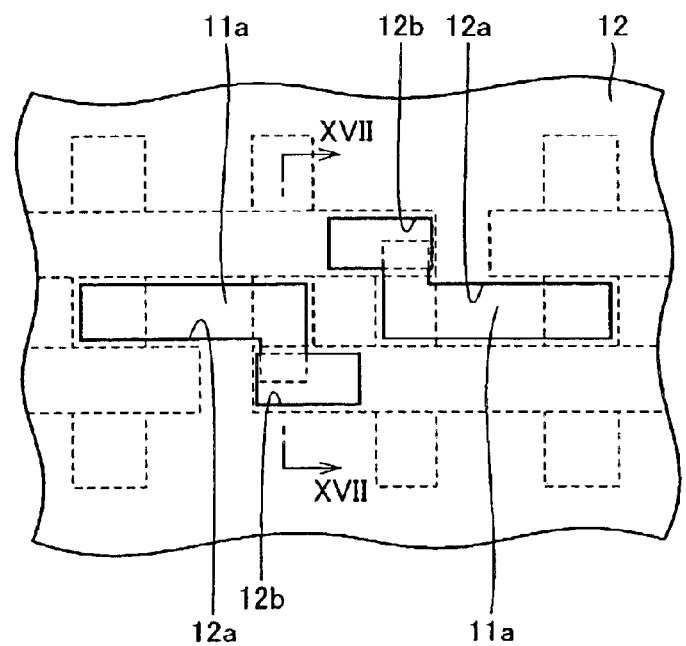
FIG. 16 is a plan view showing a step performed after the step shown in FIG. 15 in the first embodiment.
Figure 17:
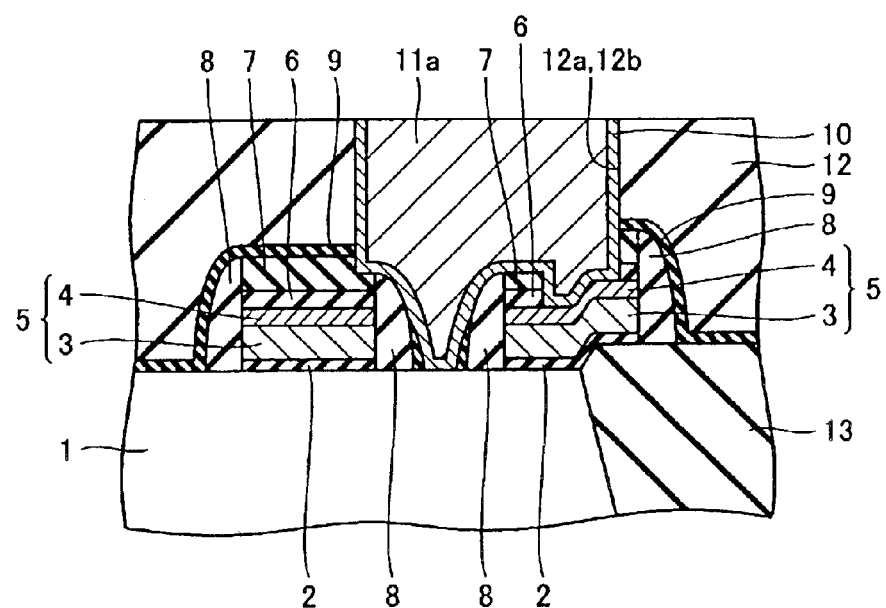
FIG. 17 is a cross-sectional view along the line XVII—XVII shown in FIG. 16 in the first embodiment.

Next, the tungsten film and the barrier metal positioned on the upper surface of silicon oxide film 12 are removed with CMP (Chemical Mechanical Polishing), for example, and tungsten film 11 is left in openings 12a and 12b, as shown in FIGS. 16 and 17.

Thus, a tungsten interconnection 11a as a conductive layer electrically connecting a portion of the element-forming region (semiconductor substrate 1) positioned in a region lying between one gate electrode 5 and another gate electrode 5 to one gate electrode 5 is formed.

According to the method of manufacturing a semiconductor device described above, tungsten 11a electrically connecting the portion of element-forming region 21 lying between two gate electrodes 5 to one gate electrode 5 is formed using two masks (reticles).

In other words, out of two masks, one mask serves to form opening 12a exposing the surface of the element-forming region (semiconductor substrate 1) positioned in a region lying between two gate electrodes 5, while another mask serves to form opening 12b exposing gate electrode 5.

In contrast to the conventional method of manufacturing a semiconductor device in which three masks were required, in the present method of manufacturing a semiconductor device, the number of masks is reduced by one. The present method can contribute to reduction of the production cost.

In addition, tungsten interconnection 11a is formed in openings 12a and 12b formed in silicon oxide film 12. Therefore, tungsten interconnection 11a is embedded, and the tungsten interconnection does not fall off as in the conventional semiconductor device. Reliability of the semiconductor device is thus improved.

Figure 18:
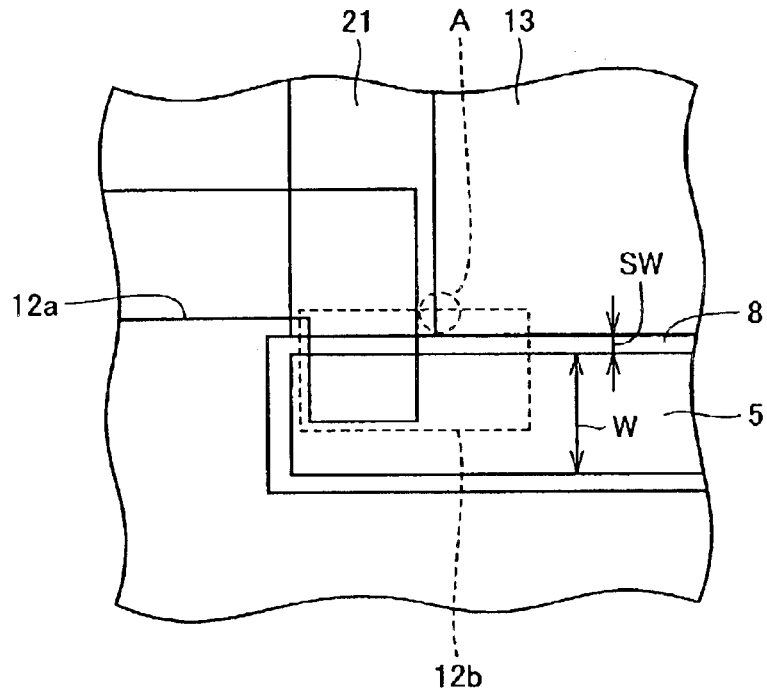
FIG. 18 is a first plan view illustrating an alignment margin in forming an opening in the first embodiment.

As shown in FIG. 18, if opening 12b is formed to expose an boundary portion (A in FIG. 18) between element isolation insulating film 13 and element-forming region 21, element isolation insulating film 13 would be etched, and the current leakage from tungsten interconnection 11a via the etched portion toward semiconductor substrate 1 would occur.

In order to form opening 12b so as not to expose such a boundary portion, resist pattern 16 (see FIG. 10) should be formed such that a region where opening 12b is formed overlaps two-dimensionally solely with one electrode 5.

Figure 19:
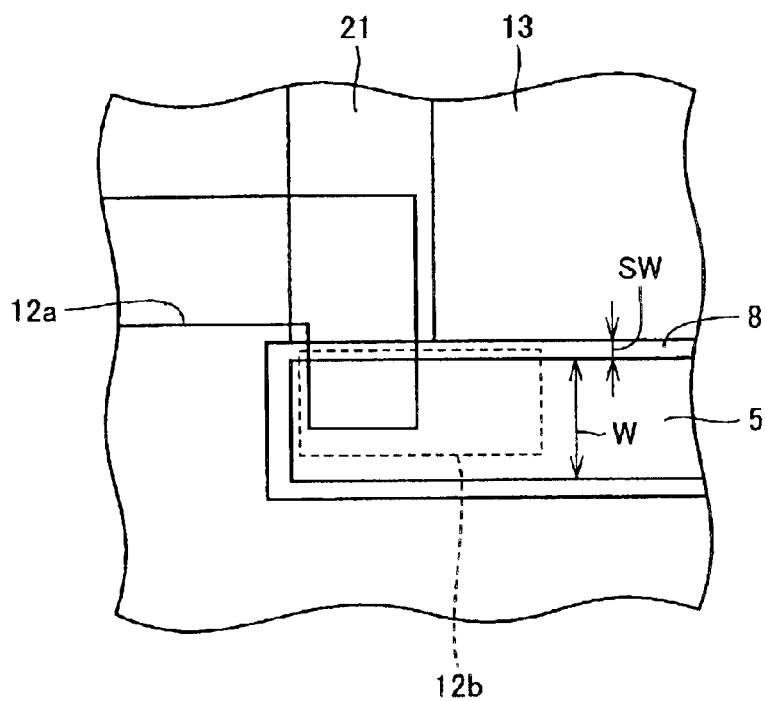
FIG. 19 is a second plan view illustrating the alignment margin in forming the opening in the first embodiment.

Here, as an alignment margin for resist pattern 16 in a direction substantially orthogonal to a direction in which one gate electrode 5 extends, a margin of a thickness SW of sidewall nitride film 8 is available, in addition to gate width W of one gate electrode 5, as shown in FIG. 19.

Therefore, the alignment margin is relatively sufficient, which will suppress forming of opening 12b in such a manner that the boundary portion between element isolation insulating film 13 and element-forming region 21 is exposed. As a result, current leakage from tungsten interconnection 11a to semiconductor substrate 1 can be avoided.

In addition, since opening 12a is formed in a self-aligned manner, so to speak, a margin for misalignment of resist pattern 14 (see FIG. 6) is high.

Figure 20:
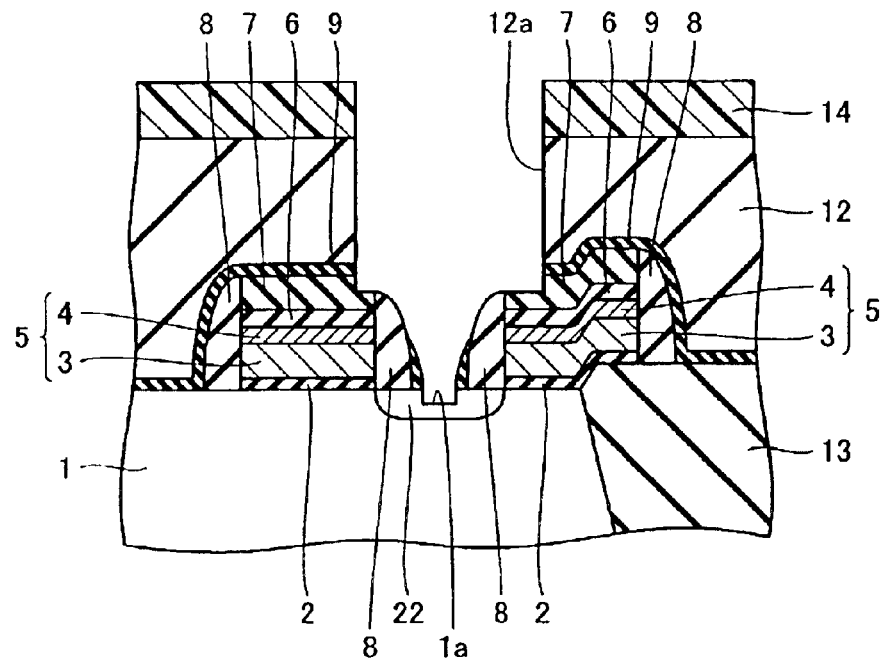
FIG. 20 is a first cross-sectional view illustrating injection into a contact in the first embodiment.

Moreover, as shown in FIG. 20, there may be a case that an impurity region 22 of a prescribed conductivity type serving as a source/drain region of a transistor formed on the surface of semiconductor substrate 1 in forming opening 12a is excessively etched, to form a depression 1a.

In such a case, a length in a direction of depth of a portion of the impurity region positioned directly under the bottom of depression 1a is made smaller, and a withstand voltage between the tungsten interconnection formed in opening 12a and semiconductor substrate 1 (a region of a conductivity type opposite to the impurity region) is lowered.

Figure 21:
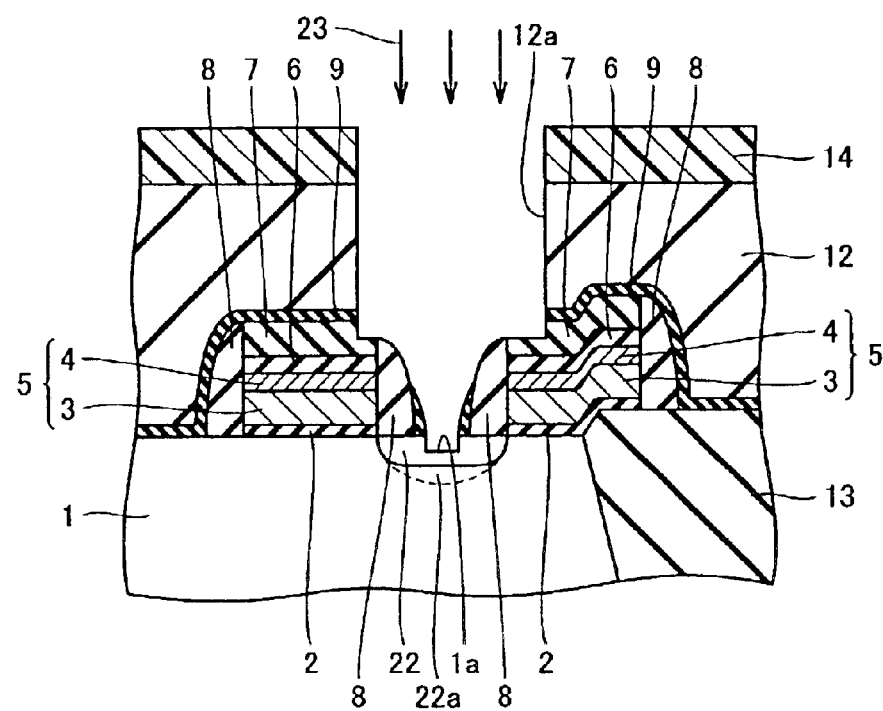
FIG. 21 is a second cross-sectional view illustrating injection into the contact in the first embodiment.

Therefore, as shown in FIG. 21, impurity ions 23 of a conductivity type identical to that of impurity region 22 are injected via opening 12a (contact injection). In doing so, impurity region 22 will have an impurity region portion 22a extending to a deeper region, to secure the withstand voltage.

Here, since neither of one gate electrode 5 nor another gate electrode 5 is exposed, each gate electrode 5 is not affected by ion injection.

Further, in forming opening 12b, the inside of opening 12a is covered with resist pattern 16 as a protection film and non-photosensitive organic film 15. As a result, the portion of the element-forming region positioned at the bottom of opening 12a, for example, will not be affected by etching when opening 12b is formed, and reliability of electrical connection of element-forming region 21 to one gate electrode 5 can be improved.

Second Embodiment

Figure 22:
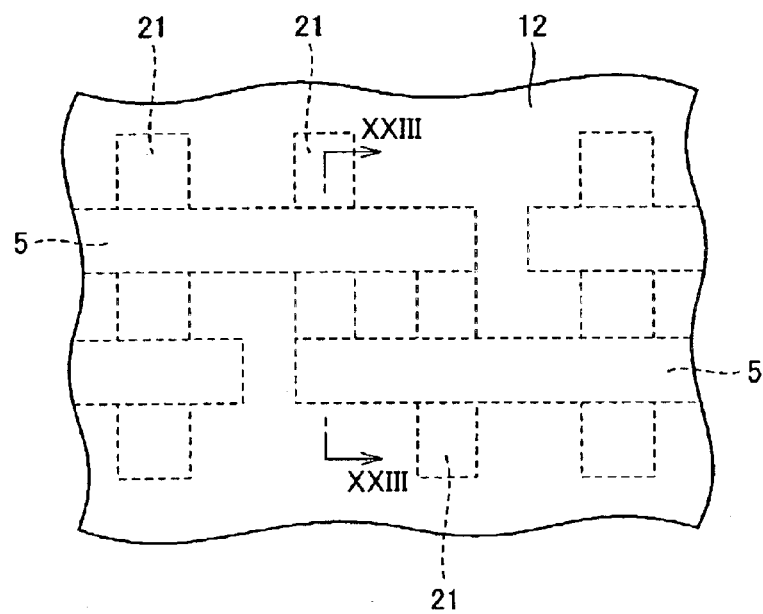
FIG. 22 is a plan view showing one process step in a method of manufacturing a semiconductor device according to a second embodiment of the present invention.
Figure 23:
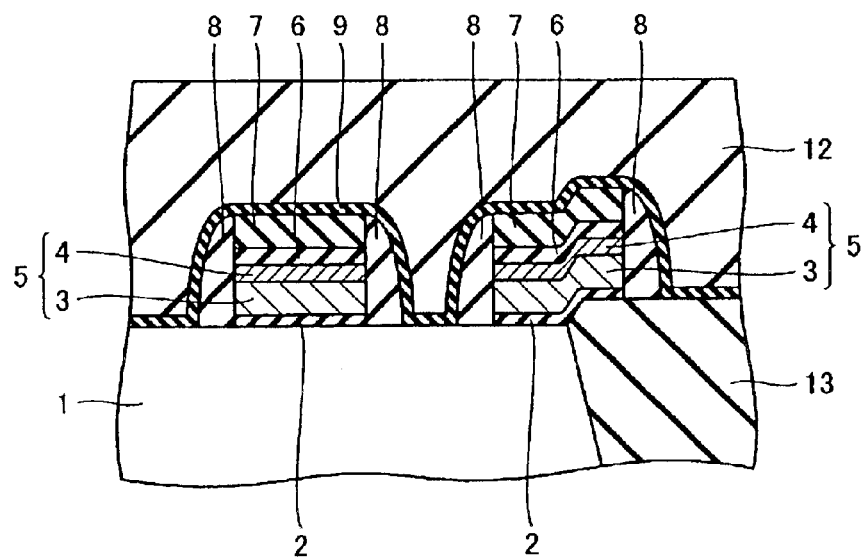
FIG. 23 is a cross-sectional view along the line XXIII—XXIII shown in FIG. 22 in the second embodiment.

A method of manufacturing a semiconductor device according to a second embodiment of the present invention will now be described. First, up to the process steps shown in FIGS. 22 and 23, process steps are similar to those shown in FIGS. 1 to 4 described above.

Figure 24:
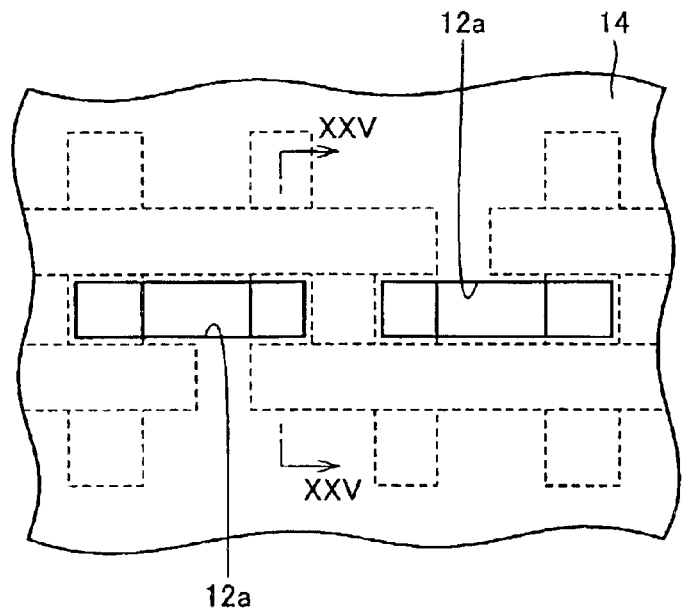
FIG. 24 is a plan view showing a step performed after the step shown in FIG. 22 in the second embodiment.
Figure 25:
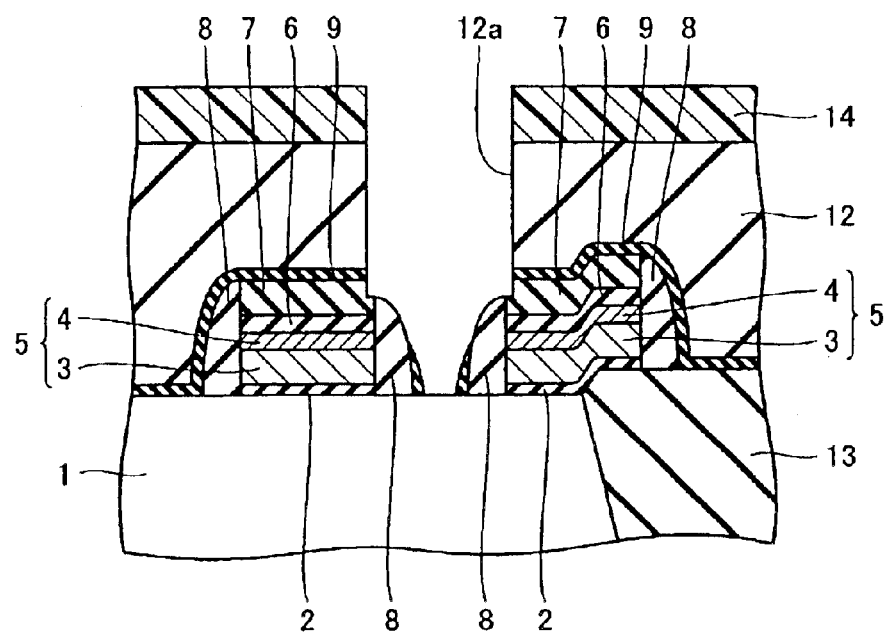
FIG. 25 is a cross-sectional view along the line XXV—XXV shown in FIG. 24 in the second embodiment.

Next, a resist (not shown) is applied on silicon oxide film 12. Then, the photolithographical process with a prescribed mask (reticle) on the resist is performed. As shown in FIGS. 24 and 25, resist pattern 14 for forming an opening exposing the surface of element-forming region 21 positioned in a region lying between two gate electrodes 5 is formed.

Figure 26:
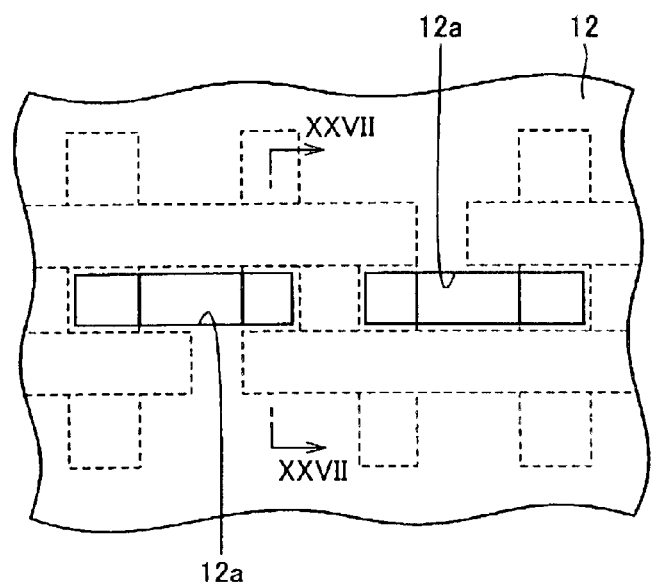
FIG. 26 is a plan view showing a step performed after the step shown in FIG. 24 in the second embodiment.
Figure 27:
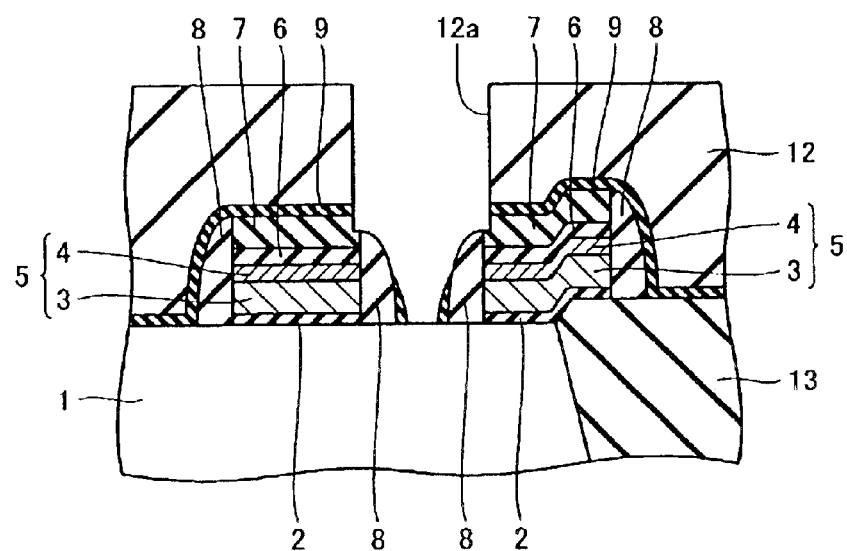
FIG. 27 is a cross-sectional view along the line XXVII—XXVII shown in FIG. 26 in the second embodiment.

Using resist pattern 14 as a mask, silicon oxide film 12 is anisotropically etched, to expose silicon nitride film 9. By anisotropically etching the exposed silicon nitride film 9, opening 12a exposing the surface of semiconductor substrate 1 (surface of the element-forming region) is formed. Thereafter, resist pattern 14 is removed, as shown in FIGS. 26 and 27.

Figure 28:
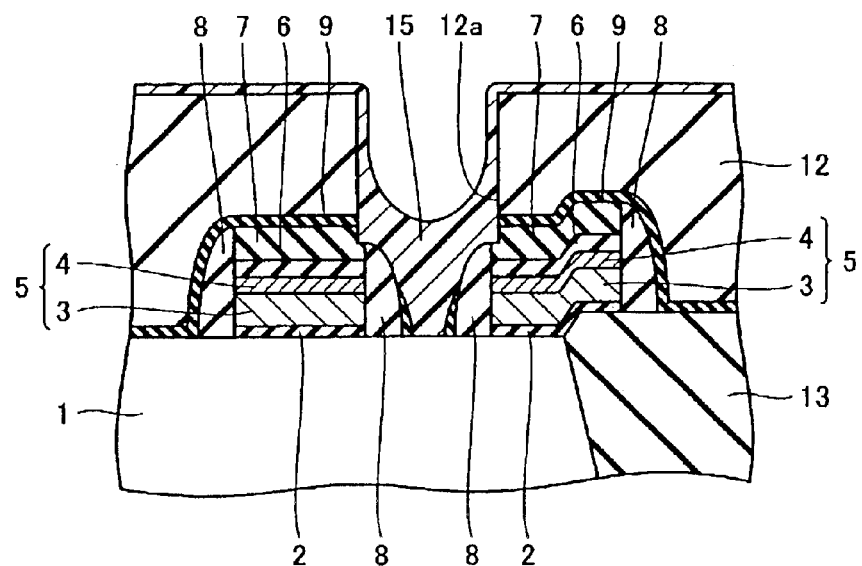
FIG. 28 is a cross-sectional view showing a step performed after the step shown in FIG. 27 in the second embodiment.

Next, using a prescribed application apparatus, a non-photosensitive, organic material is applied to semiconductor substrate 1, and non-photosensitive organic film 15 is formed mainly in opening 12a, as shown in FIG. 28.

Figure 29:
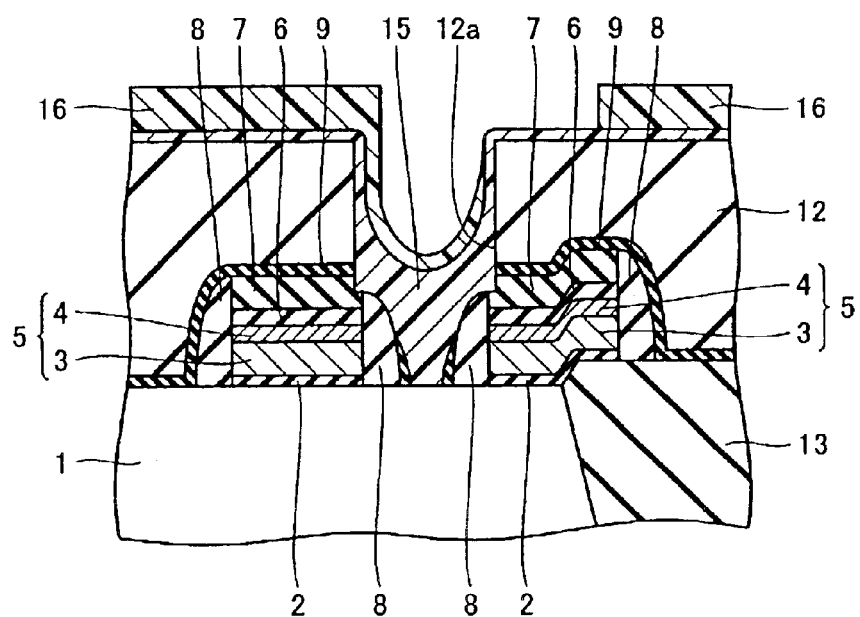
FIG. 29 is a cross-sectional view showing a step performed after the step shown in FIG. 28 in the second embodiment.

On organic film 15, a resist (not shown) is applied. The photolithographical process with a prescribed mask (reticle) is performed on the resist, and resist pattern 16 for forming an opening exposing gate electrode 5 is formed, as shown in FIG. 29.

Figure 30:
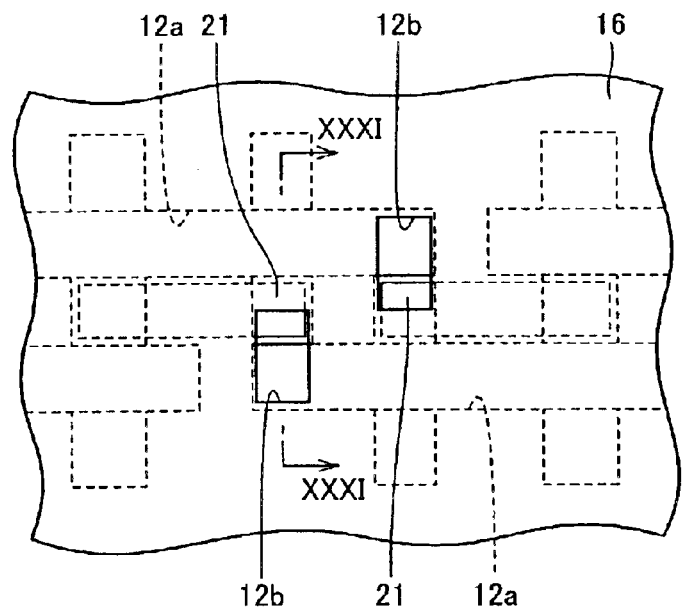
FIG. 30 is a plan view showing a step performed after the step shown in FIG. 29 in the second embodiment.

Here, as shown in FIG. 30, resist pattern 16 is formed such that a region where the opening is formed overlaps two-dimensionally (on the layout) with a portion of element-forming region 21 positioned in opening 12a.

Figure 31:
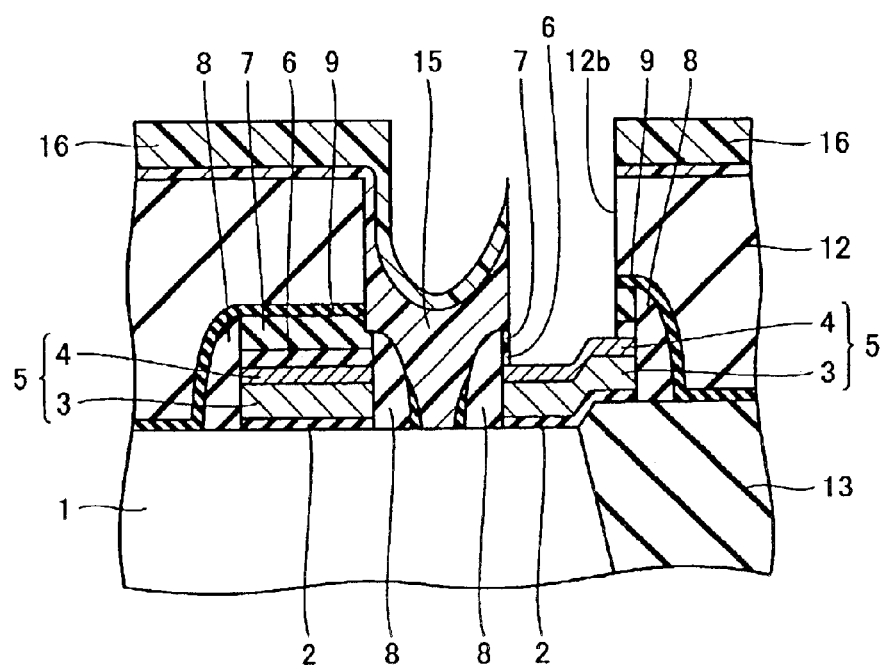
FIG. 31 is a cross-sectional view along the line XXXI—XXXI shown in FIG. 30 in the second embodiment.

Next, as shown in FIG. 31, using resist pattern 16 as a mask, prescribed anisotropic etching is performed on silicon oxide film 12, silicon nitride films 9, 7 and TEOS film 6 respectively. Thus, opening 12b exposing the surface of gate electrode 5 is formed.

Figure 32:
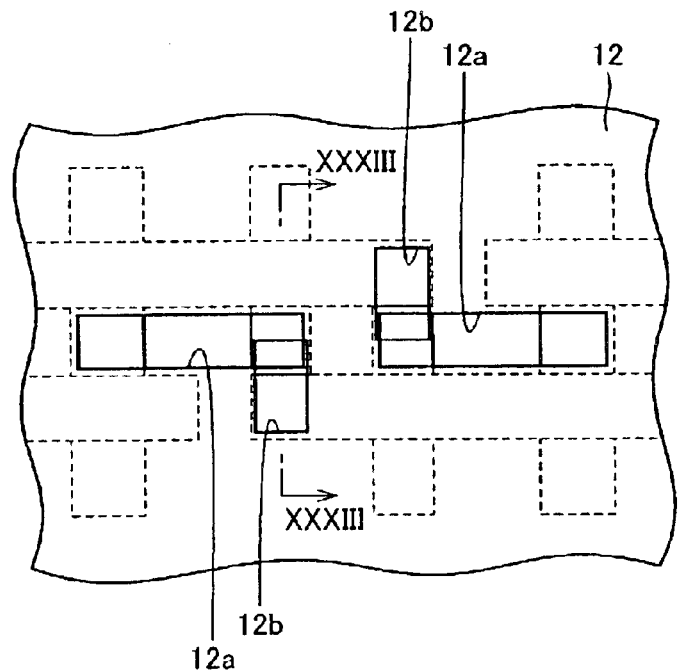
FIG. 32 is a plan view showing a step performed after the step shown in FIG. 30 in the second embodiment.
Figure 33:
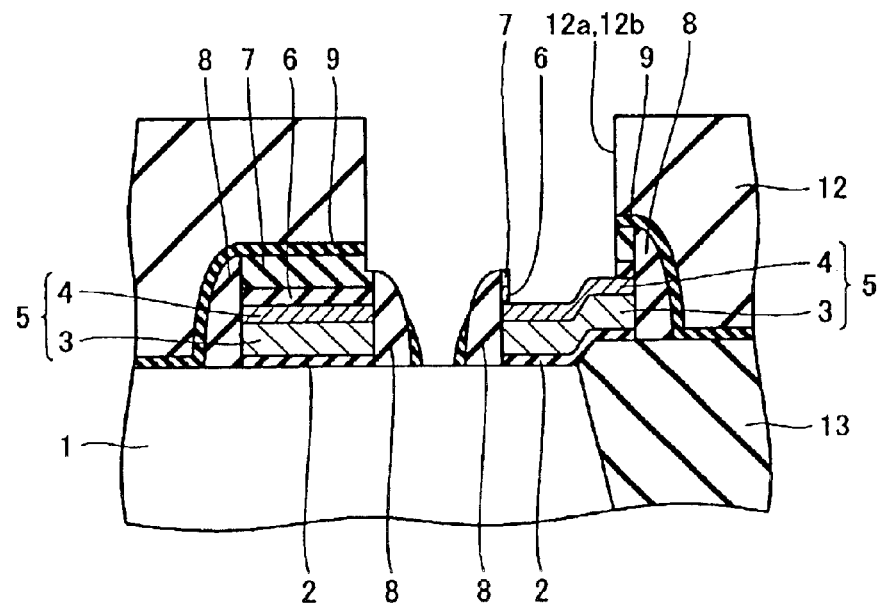
FIG. 33 is a cross-sectional view along the line XXXIII—XXXIII shown in FIG. 32 in the second embodiment.

Thereafter, as shown in FIGS. 32 and 33, resist pattern 16 and non-photosensitive organic film 15 are removed by oxygen plasma processing, for example.

Figure 34:
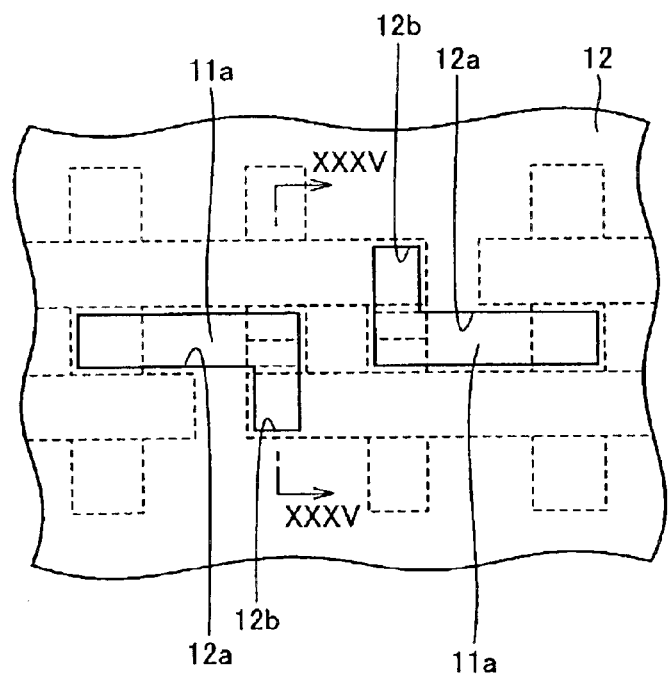
FIG. 34 is a plan view showing a step performed after the step shown in FIG. 32 in the second embodiment.
Figure 35:
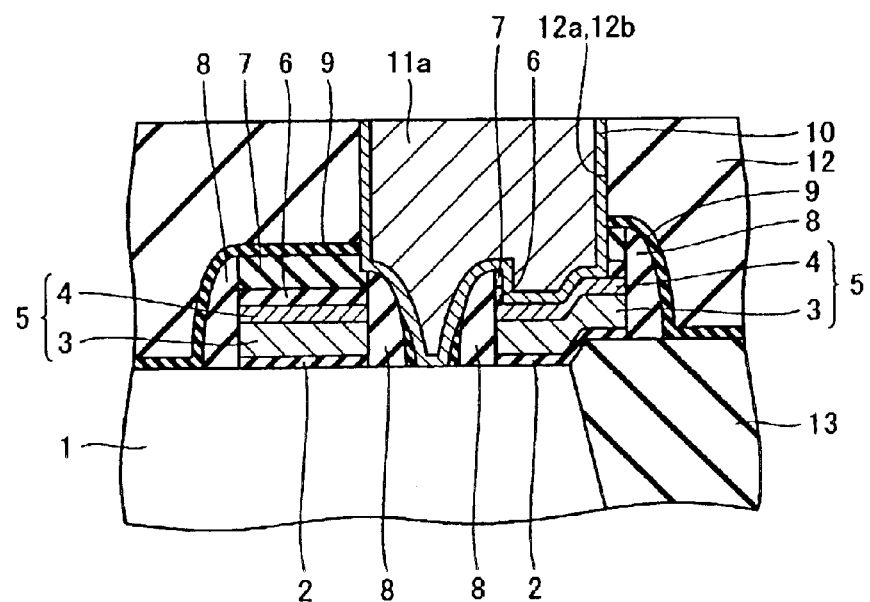
FIG. 35 is a cross-sectional view along the line XXXV—XXXV shown in FIG. 34 in the second embodiment.

Next, through process steps similar to those shown in FIGS. 15 to 17 described above, as shown in FIGS. 34 and 35, tungsten interconnection 11a electrically connecting the portion of the element-forming region (semiconductor substrate 1) positioned in a region lying between one gate electrode 5 and another gate electrode 5 to one gate electrode 5 is formed.

According to the method of manufacturing a semiconductor device described above, tungsten 11a electrically connecting a portion of element-forming region 21 lying between two gate electrodes 5 to one gate electrode 5 is formed using two masks (reticles), as described above.

Thus, compared to the conventional method of manufacturing a semiconductor device, in the present method of manufacturing a semiconductor device, the number of masks is reduced by one. The present method can contribute to reduction of the production cost.

In addition, tungsten interconnection 11a is formed in openings 12a and 12b formed in silicon oxide film 12.

Therefore, the tungsten interconnection does not fall off as in the conventional semiconductor device, and reliability of the semiconductor device is improved.

Moreover, since opening 12a is formed in a self-aligned manner, so to speak, a margin for misalignment of resist pattern 14 (see FIG. 25) is high.

Further, in forming opening 12b, the inside of opening 12a is covered with resist pattern 16 as a protection film and non-photosensitive organic film 15. As a result, the portion of the element-forming region positioned at the bottom of opening 12a, for example, will not be affected by etching when opening 12b is formed, and reliability of electrical connection of element-forming region 21 to one gate electrode 5 can be improved.

Moreover, as described above, even if a depression is formed in impurity region 22 of a prescribed conductivity type in forming opening 12a, a prescribed withstand voltage can be secured by injecting prescribed impurity ions through opening 12a.

In injecting the impurity ions, each gate electrode 5 is not affected by ion injection.

Third Embodiment

Figure 36:
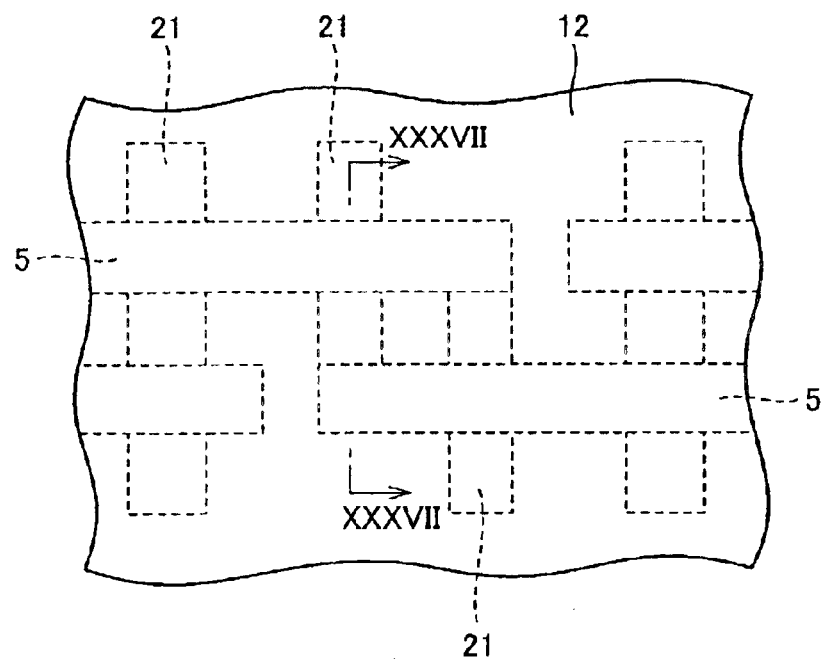
FIG. 36 is a plan showing one process step in a method of manufacturing a semiconductor device according to a third embodiment of the present invention.
Figure 37:
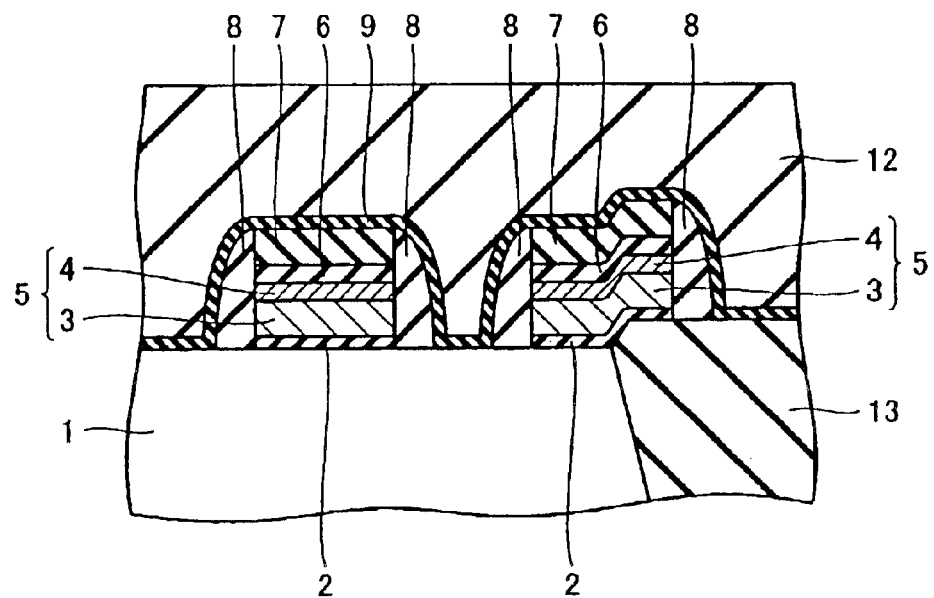
FIG. 37 is a cross-sectional view along the line XXXVII—XXXVII shown in FIG. 36 in the third embodiment.

A method of manufacturing a semiconductor device according to the third embodiment of the present invention will now be described. First, up to the process steps shown in FIGS. 36 and 37, process steps are similar to those shown in FIGS. 1 to 4 described above. Next, a resist (not shown) is applied on silicon oxide film 12.

Figure 38:
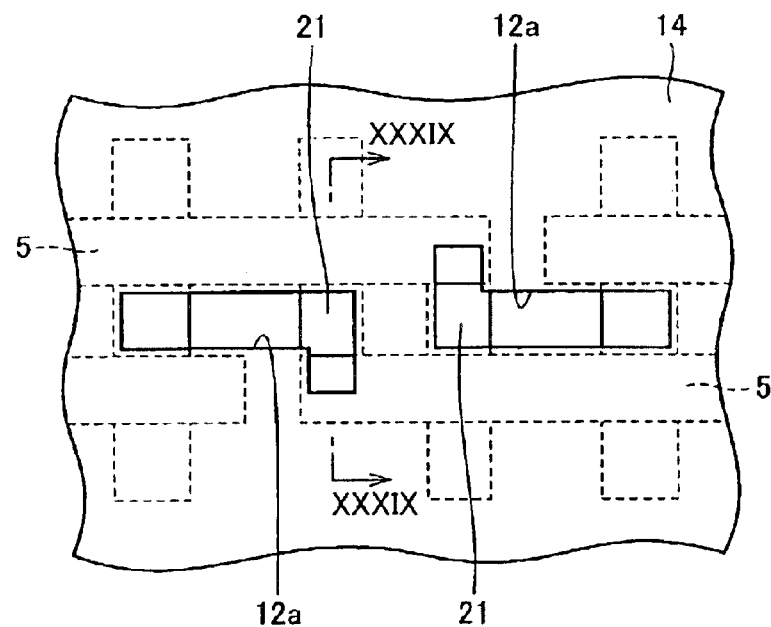
FIG. 38 is a plan view showing a step performed after the step shown in FIG. 36 in the third embodiment.
Figure 39:
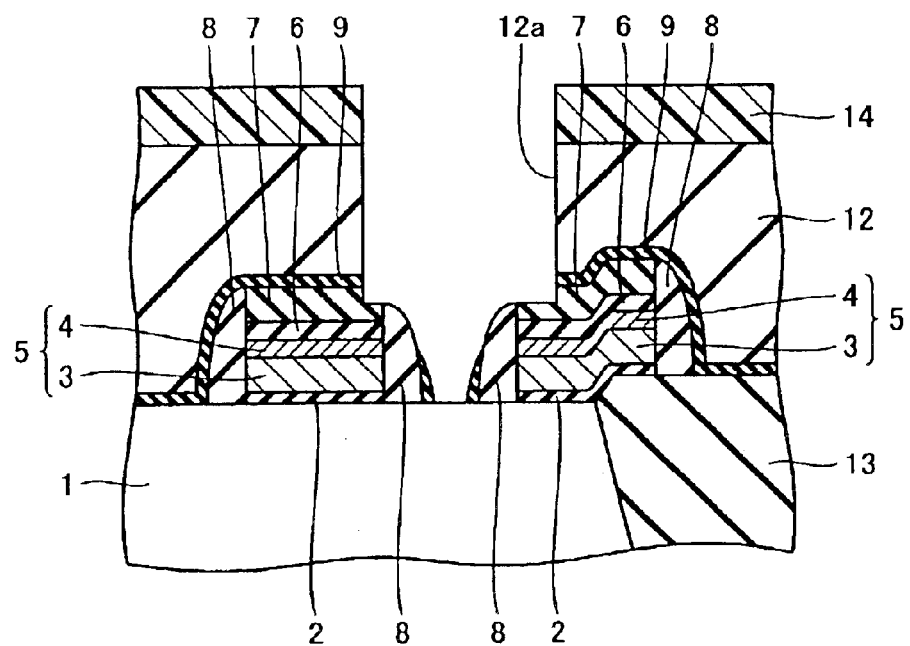
FIG. 39 is a cross-sectional view along the line XXXIX—XXXIX shown in FIG. 38 in the third embodiment.

Through the photolithographical process with a prescribed mask (reticle) on the resist, as shown in FIGS. 38 and 39, resist pattern 14 for forming an opening exposing the surface of element-forming region 21 positioned in a region lying between two gate electrodes 5 is formed. Here, resist pattern 14 is formed such that a portion of a region where the opening is formed overlaps two-dimensionally (on the layout) with a portion of gate electrode 5.

Figure 40:
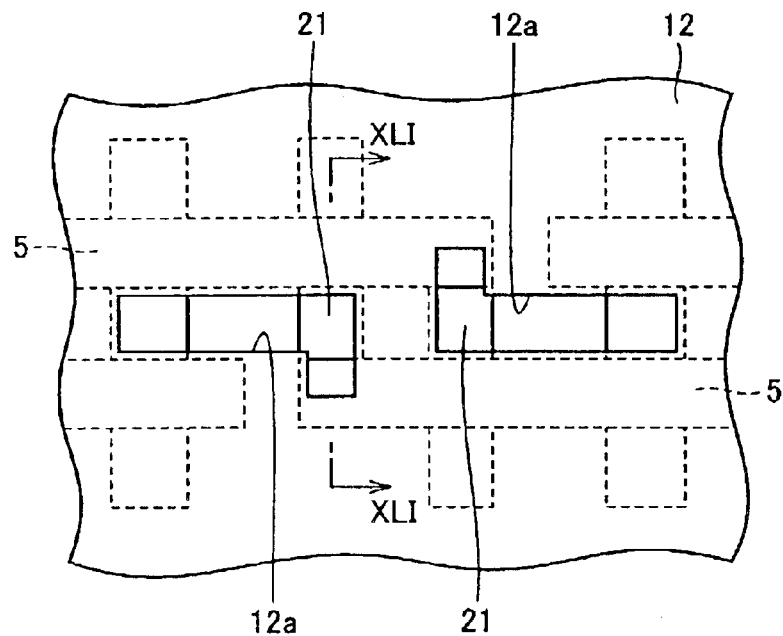
FIG. 40 is a plan view showing a step performed after the step shown in FIG. 38 in the third embodiment.
Figure 41:
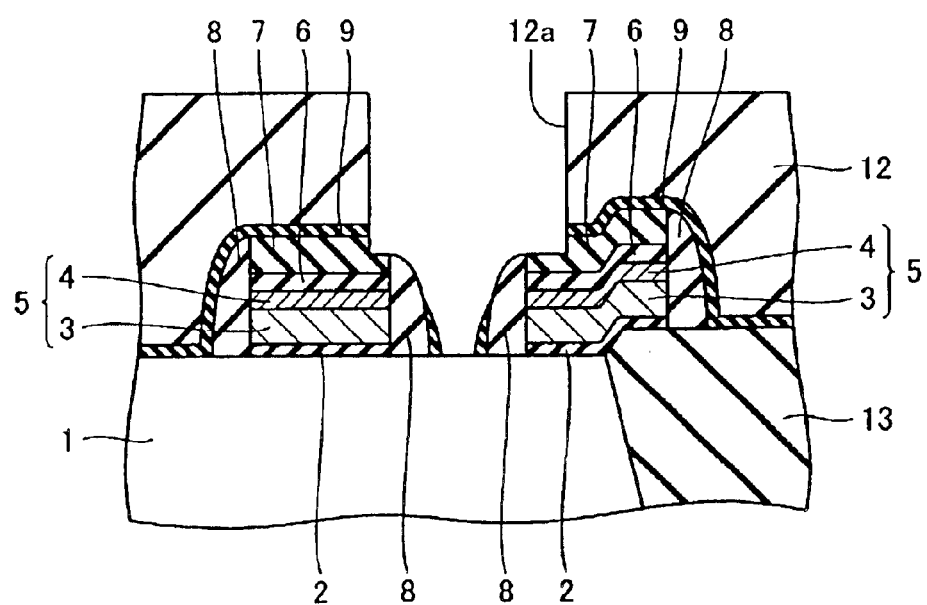
FIG. 41 is a cross-sectional view along the line XLI—XLI shown in FIG. 40 in the third embodiment.

Using resist pattern 14 as a mask, silicon oxide film 12 is anisotropically etched, to expose silicon nitride film 9. By anisotropically etching the exposed silicon nitride film 9, opening 12a exposing the surface of semiconductor substrate 1 (surface of the element-forming region) is formed. Thereafter, resist pattern 14 is removed, as shown in FIGS. 40 and 41.

Figure 42:
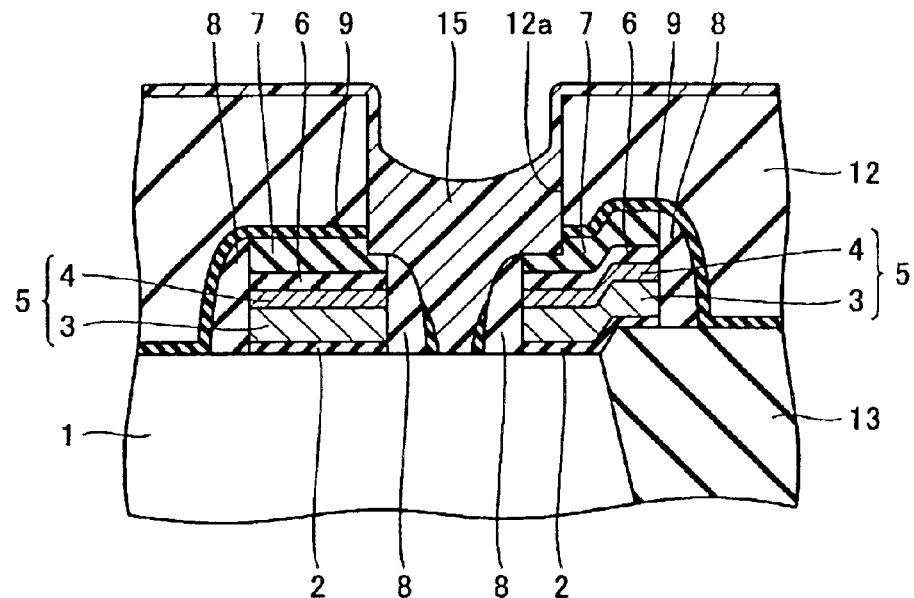
FIG. 42 is a cross-sectional view showing a step performed after the step shown in FIG. 41 in the third embodiment.

Next, using a prescribed application apparatus, a non-photosensitive, organic material is applied to semiconductor substrate 1, and non-photosensitive organic film 15 is formed mainly in opening 12a, as shown in FIG. 42.

Figure 43:
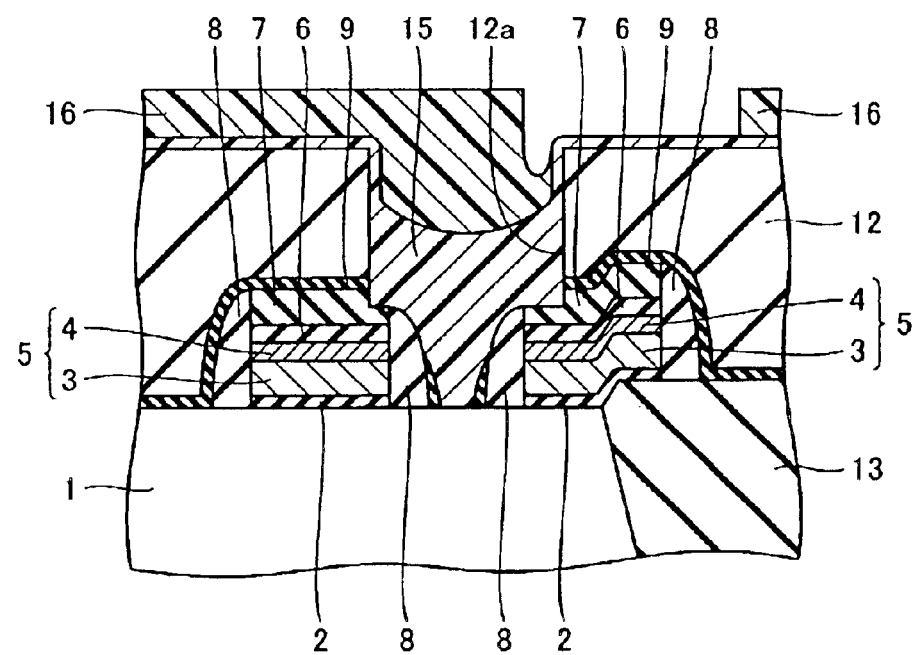
FIG. 43 is a cross-sectional view showing a step performed after the step shown in FIG. 42 in the third embodiment.

On organic film 15, a resist (not shown) is applied. The photolithographical process with a prescribed mask (reticle) is performed on the resist, and resist pattern 16 for forming an opening exposing one gate electrode 5 is formed, as shown in FIG. 43.

Figure 44:
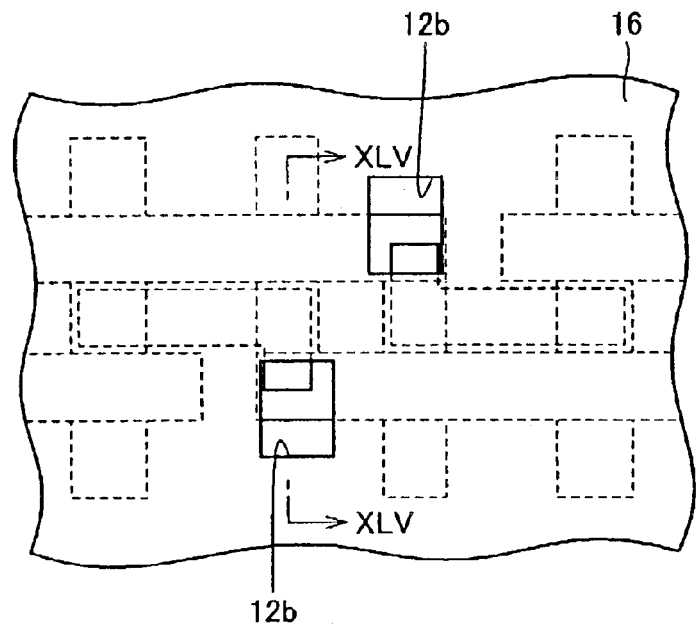
FIG. 44 is a plan view showing a step performed after the step shown in FIG. 43 in the third embodiment.

Here, as shown in FIG. 44, resist pattern 16 is formed such that the portion of the region where the opening is formed overlaps two-dimensionally (on the layout) with a portion of element isolation insulating film 13.

Figure 45:
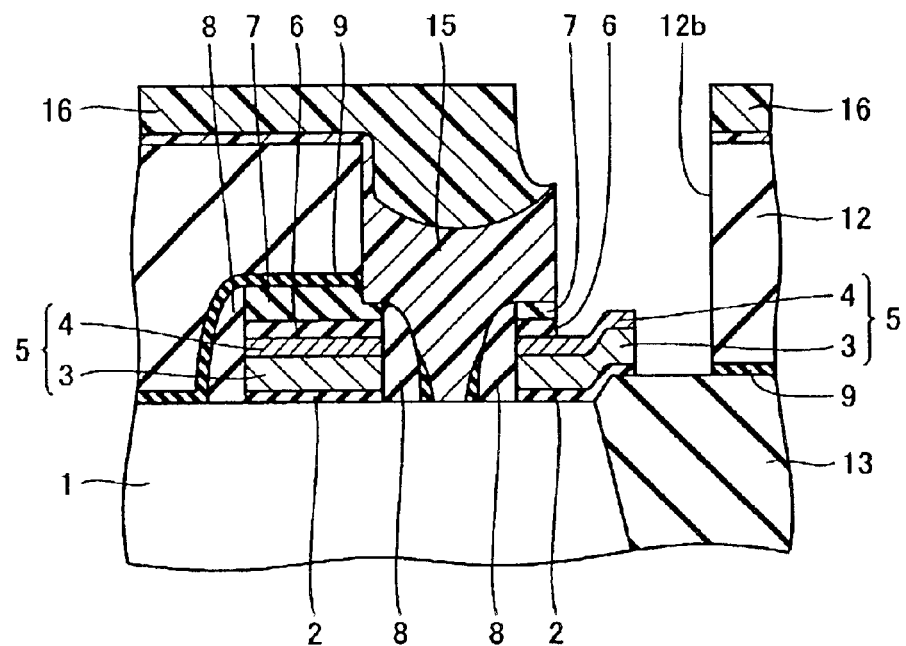
FIG. 45 is a cross-sectional view along the line XLV—XLV shown in FIG. 44 in the third embodiment.

Next, as shown in FIG. 45, using resist pattern 16 as a mask, prescribed anisotropic etching is performed on silicon oxide film 12, silicon nitride films 9, 7 and TEOS film 6 respectively. Thus, opening 12b exposing the surface of one gate electrode 5 and the surface of element isolation insulating film 13 is formed.

Figure 46:
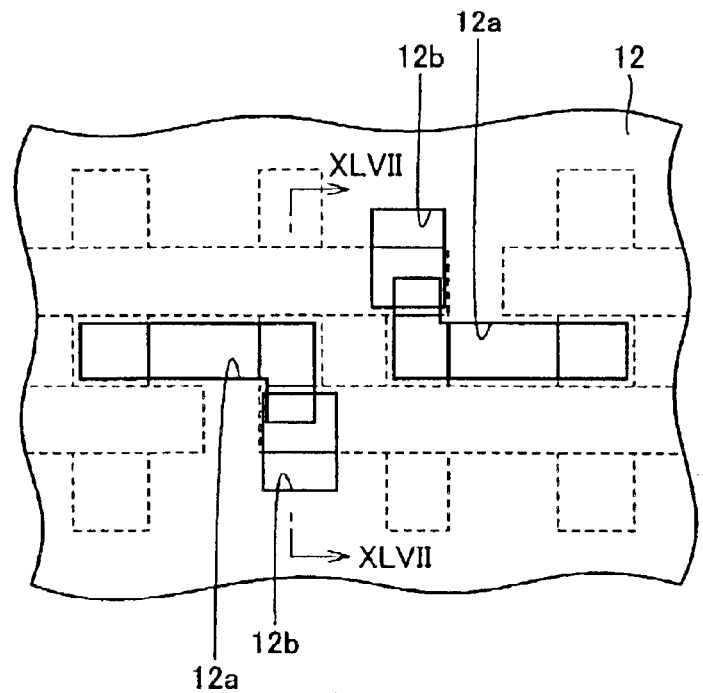
FIG. 46 is a plan view showing a step performed after the step shown in FIG. 44 in the third embodiment.
Figure 47:
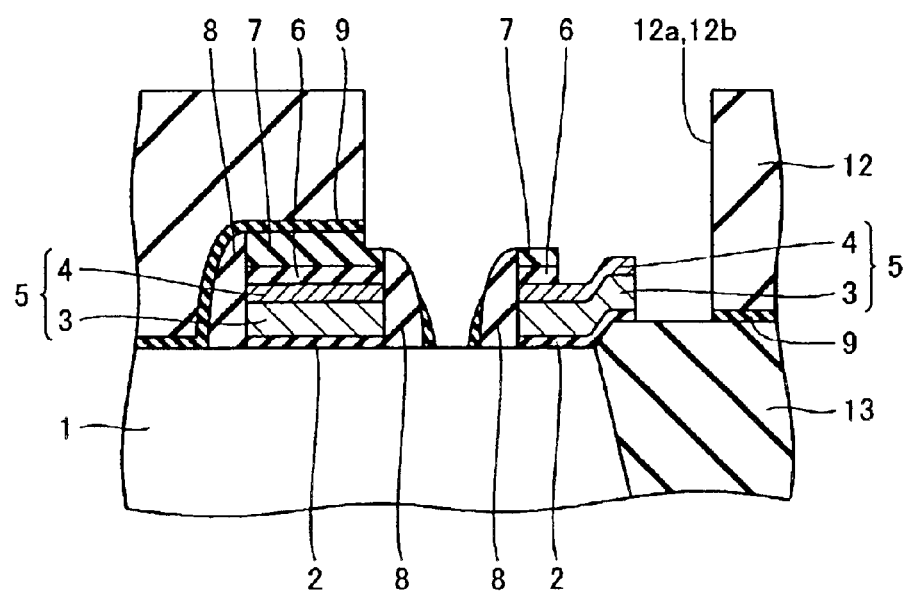
FIG. 47 is a cross-sectional view along the line XLVII—XLVII shown in FIG. 46 in the third embodiment.

Thereafter, as shown in FIGS. 46 and 47, resist pattern 16 and non-photosensitive organic film 15 are removed by oxygen plasma processing, for example.

Figure 48:
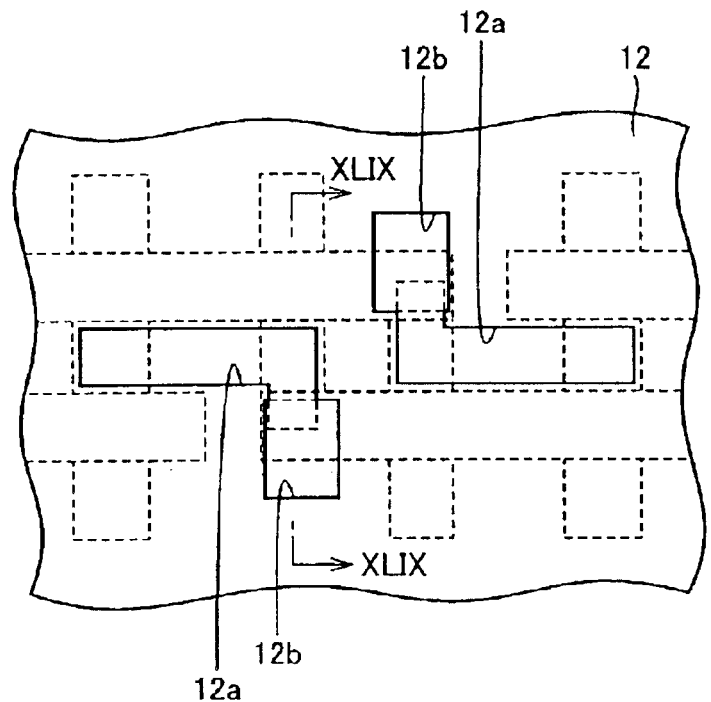
FIG. 48 is a plan view showing a step performed after the step shown in FIG. 46 in the third embodiment.
Figure 49:
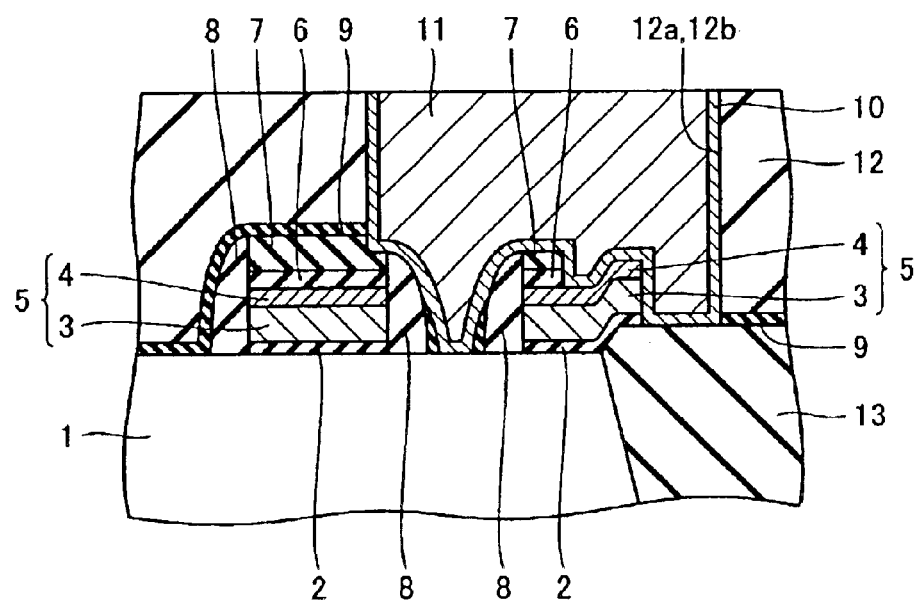
FIG. 49 is a cross-sectional view along the line XLIX—XLIX shown in FIG. 48 in the third embodiment.

Next, through process steps similar to those shown in FIGS. 15 to 17 described above, as shown in FIGS. 48 and 49, tungsten interconnection 11a electrically connecting the portion of the element-forming region (semiconductor substrate 1) positioned in a region lying between one gate electrode 5 and another gate electrode 5 to one gate electrode 5 is formed.

According to the method of manufacturing a semiconductor device described above, an effect in the following can be obtained, in addition to the effect shown in conjunction with the first embodiment.

Figure 50:
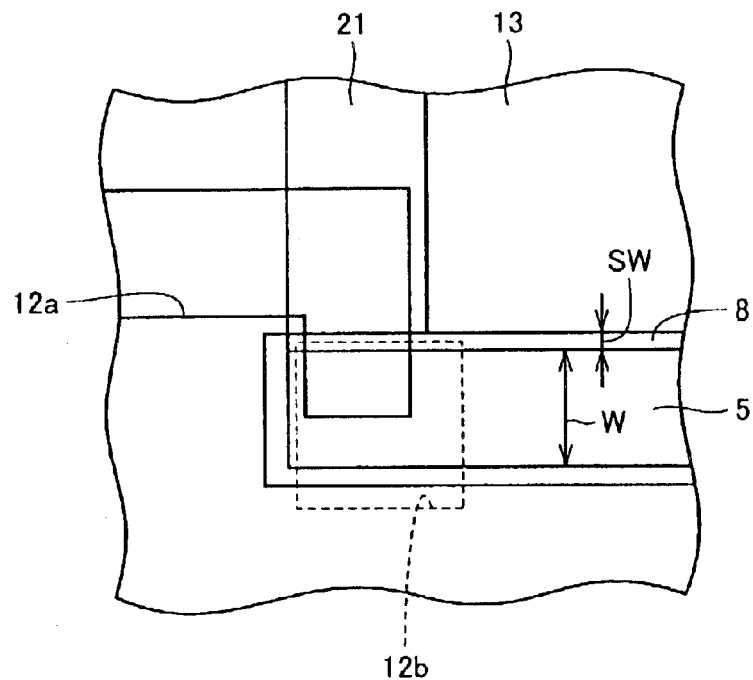
FIG. 50 is a first plan view illustrating an alignment margin in forming an opening in the third embodiment.
Figure 51:
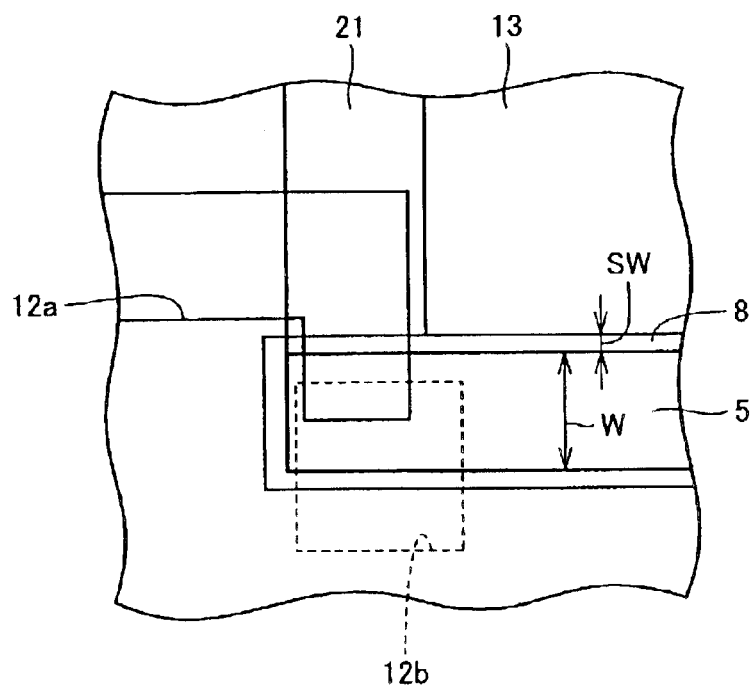
FIG. 51 is a second plan view illustrating the alignment margin in forming the opening in the third embodiment.

In forming resist pattern 16, as an alignment margin for resist pattern 16 in a direction substantially orthogonal to a direction in which one gate electrode 5 extends, as shown in FIGS. 50 and 51, a margin for the portion of the region of element isolation insulating film 13 is available, in addition to gate width W of one gate electrode 5, and thickness SW of sidewall nitride film 8.

Therefore, an alignment margin more sufficient than in the first embodiment is available, which will suppress forming of opening 12b in such a manner that the boundary portion between element isolation insulating film 13 and element-forming region 21 is exposed. As a result, current leakage from tungsten interconnection 11a to semiconductor substrate 1 can be prevented in a further ensured manner.

Moreover, in forming opening 12b, a side surface of one gate electrode 5 is exposed, in addition to the upper surface thereof. Accordingly, tungsten interconnection 11a is connected to one gate electrode 5 on the upper surface as well as on the side surface thereof. Consequently, contact resistance of tungsten interconnection 11a and one gate electrode 5 can be lowered.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:

forming on a main surface of a semiconductor substrate, one electrode portion and another electrode portion covered respectively with a first insulating film, with a space apart from each other;

forming on said semiconductor substrate, a second insulating film having an etching property different from said first insulating film, so as to cover said one electrode portion and said another electrode portion;

forming in a self-aligned manner on said second insulating film, a first opening exposing a portion of a region of said semiconductor substrate lying between said one electrode portion and said another electrode portion;

forming a second opening exposing a surface of said one electrode in said second insulating film and said first insulating film; and forming a conductive layer within said first opening and said second opening; wherein a first forming region where said first opening is formed and a second forming region where said second opening is formed are arranged so as to have a portion two-dimensionally overlapping with each other, and are formed such that said first opening communicates with said second opening.

2. The method of manufacturing a semiconductor device according to claim 1, further comprising the steps of covering said first opening with a prescribed protection film having an etching property different from said second insulating film, after said first opening is formed and before said second opening is formed, and removing said protection film after said second opening is formed and before said conductive layer is formed.

3. The method of manufacturing a semiconductor device according to claim 2, wherein in the step of forming said first opening, said first forming region is arranged so as to have a portion two-dimensionally overlapping with said one electrode portion, and in the step of forming said second opening, said second forming region is arranged so as to overlap with said first forming region in a portion where said first forming region two-dimensionally overlaps with said one electrode portion.

4. The method of manufacturing a semiconductor device according to claim 3, further comprising the step of forming an element-forming region sectioned by an element isolation insulating film, before said one electrode portion and said another electrode portion are formed, wherein in the step of forming said one electrode portion, said one electrode portion is formed so as to continuously cover a portion of said element-forming region and a portion of said element isolation insulating film, over a boundary portion between said element-forming region and said element isolation insulating film, and in the step of forming said second opening, said second forming region is arranged so as to have a portion two-dimensionally overlapping with said element isolation insulating film.

5. The method of manufacturing a semiconductor device according to claim 4, further comprising the step of introducing an impurity of a prescribed conductivity type into the portion of said element-forming region which is exposed, after said first opening is formed and before said protection film is formed.

6. The method of manufacturing a semiconductor device according to claim 3, further comprising the step of introducing an impurity of a prescribed conductivity type into the portion of said element-forming region which is exposed, after said first opening is formed and before said protection film is formed.

7. The method of manufacturing a semiconductor device according to claim 2, wherein in the step of forming said second opening, said second forming region is arranged so as to have a portion two-dimensionally overlapping with the portion of said element-forming region positioned in said first forming region.

8. The method of manufacturing a semiconductor device according to claim 7, further comprising the step of introducing an impurity of a prescribed conductivity type into the portion of said element-forming region which is exposed, after said first opening is formed and before said protection film is formed.

9. The method of manufacturing a semiconductor device according to claim 2, further comprising the step of introducing an impurity of a prescribed conductivity type into the portion of said element-forming region which is exposed, after said first opening is formed and before said protection film is formed.

10. The method of manufacturing a semiconductor device according to claim 1, further comprising the step of introducing an impurity of a prescribed conductivity type into the portion of said element-forming region which is exposed, after said first opening is formed and before said protection film is formed.

* * * * *